(12) United States Patent
Hiramoto et al.

(10) Patent No.: US 12,477,763 B2
(45) Date of Patent: Nov. 18, 2025

(54) SEMICONDUCTOR DEVICE

(71) Applicants: The University of Tokyo, Tokyo (JP); Toshiba Electronic Devices & Storage Corporation, Tokyo (JP); Mitsubishi Electric Corporation, Tokyo (JP)

(72) Inventors: Toshiro Hiramoto, Tokyo (JP); Takuya Saraya, Tokyo (JP); Kiyoshi Takeuchi, Tokyo (JP); Kazuo Itou, Tokyo (JP); Toshihiko Takakura, Tokyo (JP); Munetoshi Fukui, Tokyo (JP); Shinichi Suzuki, Tokyo (JP); Katsumi Satoh, Tokyo (JP); Tomoko Matsudai, Tokyo (JP)

(73) Assignees: The University of Tokyo, Tokyo (JP); Toshiba Electronic Devices & Storage Corporation, Tokyo (JP); Mitsubishi Electric Corporation, Tokyo (JP)

( * ) Notice: Subject to any disclaimer, the term of this patent is extended or adjusted under 35 U.S.C. 154(b) by 407 days.

(21) Appl. No.: 18/255,425

(22) PCT Filed: Nov. 16, 2021

(86) PCT No.: PCT/JP2021/042046
§ 371 (c)(1),
(2) Date: Jun. 1, 2023

(87) PCT Pub. No.: WO2022/118650
PCT Pub. Date: Jun. 9, 2022

(65) Prior Publication Data
US 2024/0097013 A1 Mar. 21, 2024

(30) Foreign Application Priority Data
Dec. 4, 2020 (JP) .................................. 2020202329

(51) Int. Cl.
H10D 12/00 (2025.01)
H10D 8/00 (2025.01)
H10D 62/10 (2025.01)

(52) U.S. Cl.
CPC ............. *H10D 12/481* (2025.01); *H10D 8/00* (2025.01); *H10D 62/127* (2025.01)

(58) Field of Classification Search
CPC ...... H10D 12/481; H10D 8/00; H10D 62/127; H10D 12/038; H10D 62/393; H10D 64/117; H10D 62/106; H10D 62/142
(Continued)

(56) References Cited

U.S. PATENT DOCUMENTS

| 5,381,026 A | * | 1/1995 | Shinohe | H10D 18/655 257/148 |
| 2002/0060330 A1 | * | 5/2002 | Onishi | H10D 30/658 257/E29.264 |

(Continued)

FOREIGN PATENT DOCUMENTS

| JP | H0837295 A | 2/1996 |
| JP | 2001320049 A | 11/2001 |

(Continued)

OTHER PUBLICATIONS

Saraya, T. et al., 3.3 kV Back-Gate-Controlled IGBT (BC-IGBT) Using Manufacturable Double-Side Process Technology, IEEE Xplore, Jan. 17, 2022.

(Continued)

*Primary Examiner* — Mohammad M Hoque
(74) *Attorney, Agent, or Firm* — Fox Rothschild LLP; Carol E. Thorstad-Forsyth

(57) ABSTRACT

A semiconductor device includes an emitter layer of a first conductivity type, a collector layer of a first conductivity
(Continued)

type, a drift layer of a second conductivity type provided between the emitter layer and the collector layer, an emitter electrode electrically connected to the emitter layer, a collector electrode electrically connected to the collector layer, one or a plurality of emitter-side gate electrodes arranged to face the emitter layer with an emitter-side gate insulating film interposed therebetween, a first high-concentration impurity layer of a second conductivity type provided between the emitter electrode and the emitter layer, the first high-concentration impurity layer having an impurity concentration higher than an impurity concentration of the emitter layer, an impurity layer of a first conductivity type provided between the drift layer and the collector electrode, one or a plurality of collector-side gate electrodes arranged to face the impurity layer with a collector-side gate insulating film interposed therebetween, and a second high-concentration impurity layer of a second conductivity type provided between the collector electrode and the impurity layer and having an impurity concentration higher than that of the impurity layer, in which a total length of a first facing region of the emitter-side gate electrode in a gate width direction, the first facing region facing the emitter layer with the emitter-side gate insulating film interposed therebetween, is longer than a total length of a second facing region of the collector-side gate electrode in a gate width direction, the second facing region facing the impurity layer with the collector-side gate insulating film interposed therebetween.

7 Claims, 17 Drawing Sheets

(58) Field of Classification Search
USPC .......................................................... 257/139
See application file for complete search history.

(56) References Cited

U.S. PATENT DOCUMENTS

| 2011/0285427 | A1* | 11/2011 | Koyama | H01L 24/73 |
| | | | | 257/E29.198 |
| 2017/0077273 | A1* | 3/2017 | Kitagawa | H10D 64/256 |
| 2020/0091323 | A1* | 3/2020 | Iwakaji | H10D 64/517 |
| 2020/0303524 | A1* | 9/2020 | Matsudai | H10D 12/481 |
| 2020/0303526 | A1* | 9/2020 | Iwakaji | H10D 62/142 |
| 2022/0085193 | A1* | 3/2022 | Matsudai | H10D 62/106 |
| 2022/0149189 | A1* | 5/2022 | Satoh | H10D 62/106 |

FOREIGN PATENT DOCUMENTS

| JP | 2010123667 A | 6/2010 |
| JP | 202015581 A | 1/2020 |
| JP | 2020047789 A | 3/2020 |
| JP | 202061429 A | 4/2020 |
| JP | 2021150544 A | 9/2021 |

OTHER PUBLICATIONS

International Search Report for PCT/JP2021/042046 dated Feb. 1, 2022, 3 pages.

* cited by examiner (a)

(b)

(c)

SEMICONDUCTOR DEVICE

RELATED APPLICATION DATA

The present application is a national phase filing of PCT/JP2021/042046 filed Nov. 16, 2021, which claims priority to Japanese Patent Application No. 2020-202329 filed Dec. 4, 2020. The content of these applications are incorporated herein by reference in their entirety.

TECHNICAL FIELD

The present invention relates to a semiconductor device.

BACKGROUND ART

One of the power semiconductor devices is an insulated gate bipolar transistor (hereinafter referred to as "IGBT"). The IGBT is a semiconductor device in which an input portion has a MOSFET structure and an output portion has a bipolar structure. The IGBT is provided to compensate for the disadvantage of the large loss during conduction of the MOS transistor, but the switching loss tends to be larger than that of a power MOSFET. Such an IGBT is known, for example, from PTL 1 and PTL 2.

In the voltage-driven semiconductor device described in PTL 1, in addition to the first transistor, a second transistor having different polarities is formed at the drain of the first transistor, and carriers are supplied from the second transistor to the drain of the first transistor. With such a configuration, in the voltage-driven semiconductor device described in PTL 1, conductivity modulation is caused in the drain of the first transistor, a conduction loss is reduced, and an ON voltage drop can be reduced.

The semiconductor device described in PTL 2 is a planar gate type IGBT including a main gate electrode on a surface of a semiconductor layer. In addition, the semiconductor device includes a control gate electrode on the back surface of the semiconductor layer. The semiconductor device of PTL 2 can curb injection of holes into the drift region and reduce turn-off loss (switching loss) during turn-off operation.

CITATION LIST

Patent Literature

PTL 1: Japanese Patent Application Laid-Open No. H8-37295
PTL 2: Japanese Patent Application Laid-Open No. 2020-47789

SUMMARY OF THE INVENTION

Technical Problem

However, as described in PTL 1, in the configuration in which the conduction loss is reduced using the conductivity modulation effect, a tail current is generated in the latter half of the turn-off of the first transistor and the second transistor, and the switching loss increases. In order to improve this point, as described in PTL 2, when a control gate electrode is provided on one surface of a semiconductor layer, a space for forming a collector electrode is limited, an injection amount of carriers for causing conductivity modulation is reduced, and a loss during conduction increases. That is, in the IGBT, the reduction of the conduction loss and the reduction of the switching loss are in a trade-off relationship.

The present invention has been made in view of the above points, and an object of the present invention is to provide a semiconductor device capable of reducing switching loss at turn-off while suppressing conduction loss.

Solution to Problem

In order to solve such a problem, a semiconductor device according to the present invention includes an emitter layer of a first conductivity type, a collector layer of a first conductivity type, a drift layer of a second conductivity type provided between the emitter layer and the collector layer, an emitter electrode electrically connected to the emitter layer, a collector electrode electrically connected to the collector layer, one or a plurality of emitter-side gate electrodes arranged to face the emitter layer with an emitter-side gate insulating film interposed therebetween, a first high-concentration impurity layer of a second conductivity type provided between the emitter electrode and the emitter layer, the first high-concentration impurity layer having an impurity concentration higher than an impurity concentration of the emitter layer, an impurity layer of a first conductivity type provided between the drift layer and the collector electrode, one or a plurality of collector-side gate electrodes arranged to face the impurity layer with a collector-side gate insulating film interposed therebetween, and a second high-concentration impurity layer of a second conductivity type provided between the collector electrode and the impurity layer and having an impurity concentration higher than that of the impurity layer, in which a total length of a first facing region of the emitter-side gate electrode in a gate width direction, the first facing region facing the emitter layer with the emitter-side gate insulating film interposed therebetween, is longer than a total length of a second facing region of the collector-side gate electrode in a gate width direction, the second facing region facing the impurity layer with the collector-side gate insulating film interposed therebetween.

Advantageous Effects of the Invention

According to the present invention, the length in the gate width direction in the first facing region of the emitter-side gate electrode disposed facing the emitter layer with the emitter-side gate insulating film interposed therebetween is made longer than the length in the gate width direction in the second facing region of the collector-side gate electrode disposed facing the impurity layer with the collector-side gate insulating film interposed therebetween, whereby the switching loss at the time of turn-off can be reduced while suppressing the conduction loss at the time of electron injection into the drift layer.

BRIEF DESCRIPTION OF DRAWINGS

FIG. 13 is a timing chart for illustrating a modification example of an operation of the semiconductor device of the first embodiment when the semiconductor device is turned on.

Figure 15:
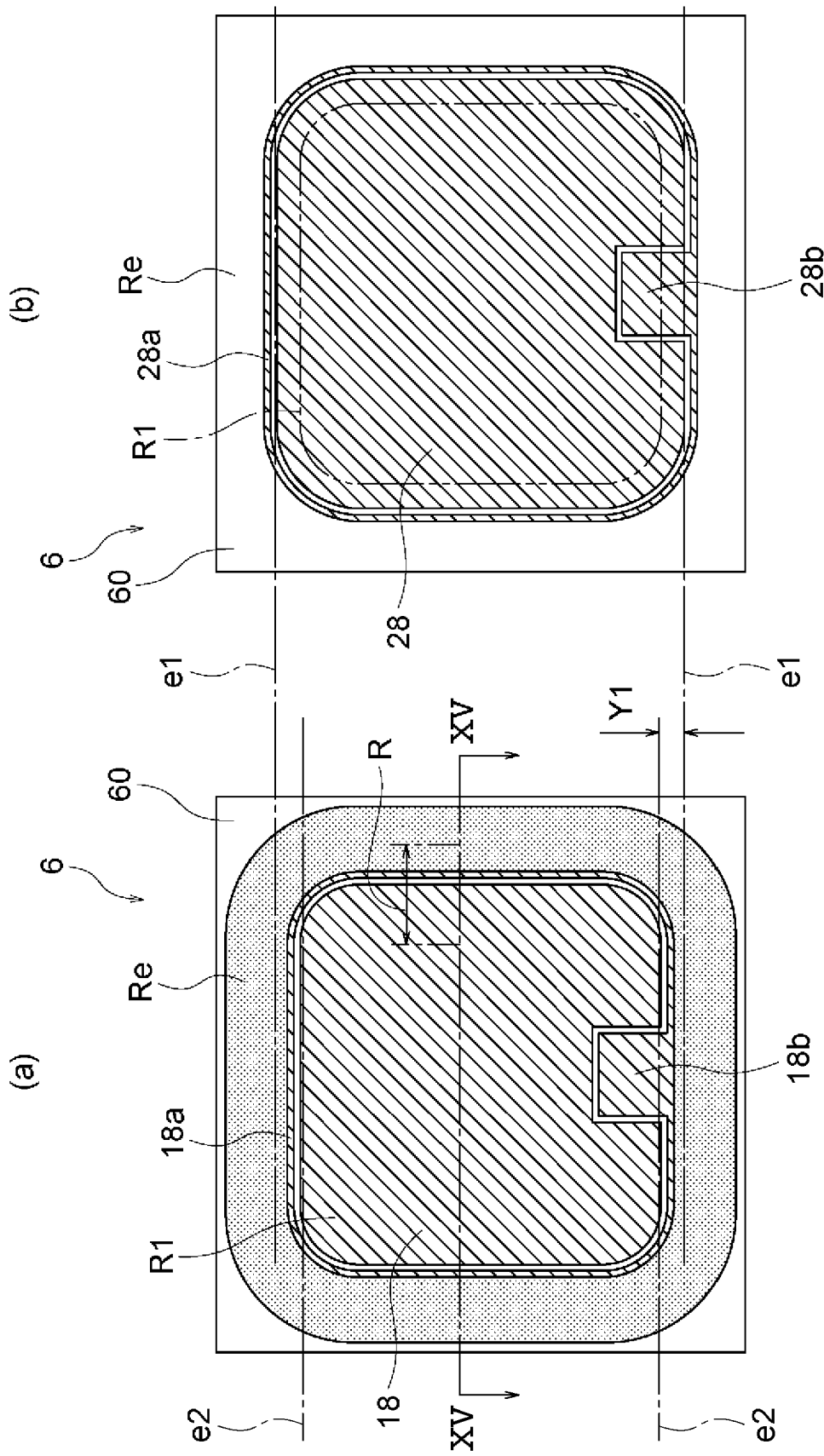

(a) of FIG. 15 is a view illustrating an upper surface of an emitter electrode. (b) of FIG. 15 is a view illustrating an upper surface of a collector electrode.

Figure 16:
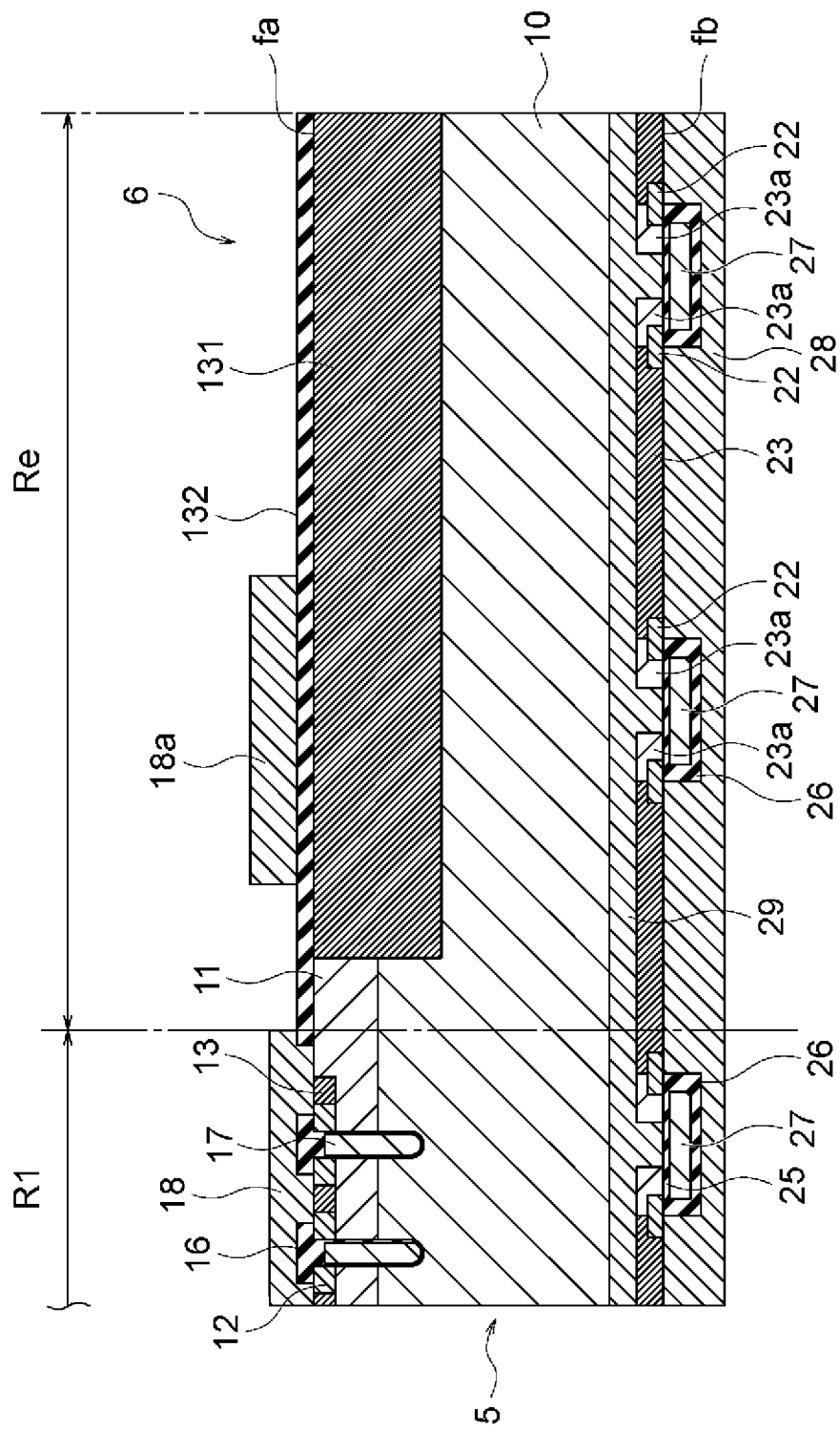

FIG. 16 is a cross-sectional view of the semiconductor device illustrated in (a) of FIG. 15 and (b) of FIG. 15 when a range R illustrated in (a) of FIG. 15 is cut along an alternate long and short dash line between arrows XV and XV, and the cross section is viewed in a direction of arrow XV.

DESCRIPTION OF EMBODIMENTS

Hereinafter, a first embodiment and a second embodiment of the present invention will be described. In the drawings of the first embodiment and the second embodiment, the same members are denoted by the same reference numerals, and the description of overlapping parts is omitted.

First Embodiment

Hereinafter, a first embodiment of the present invention will be described.

(Configuration of Semiconductor Device)

Figure 1:
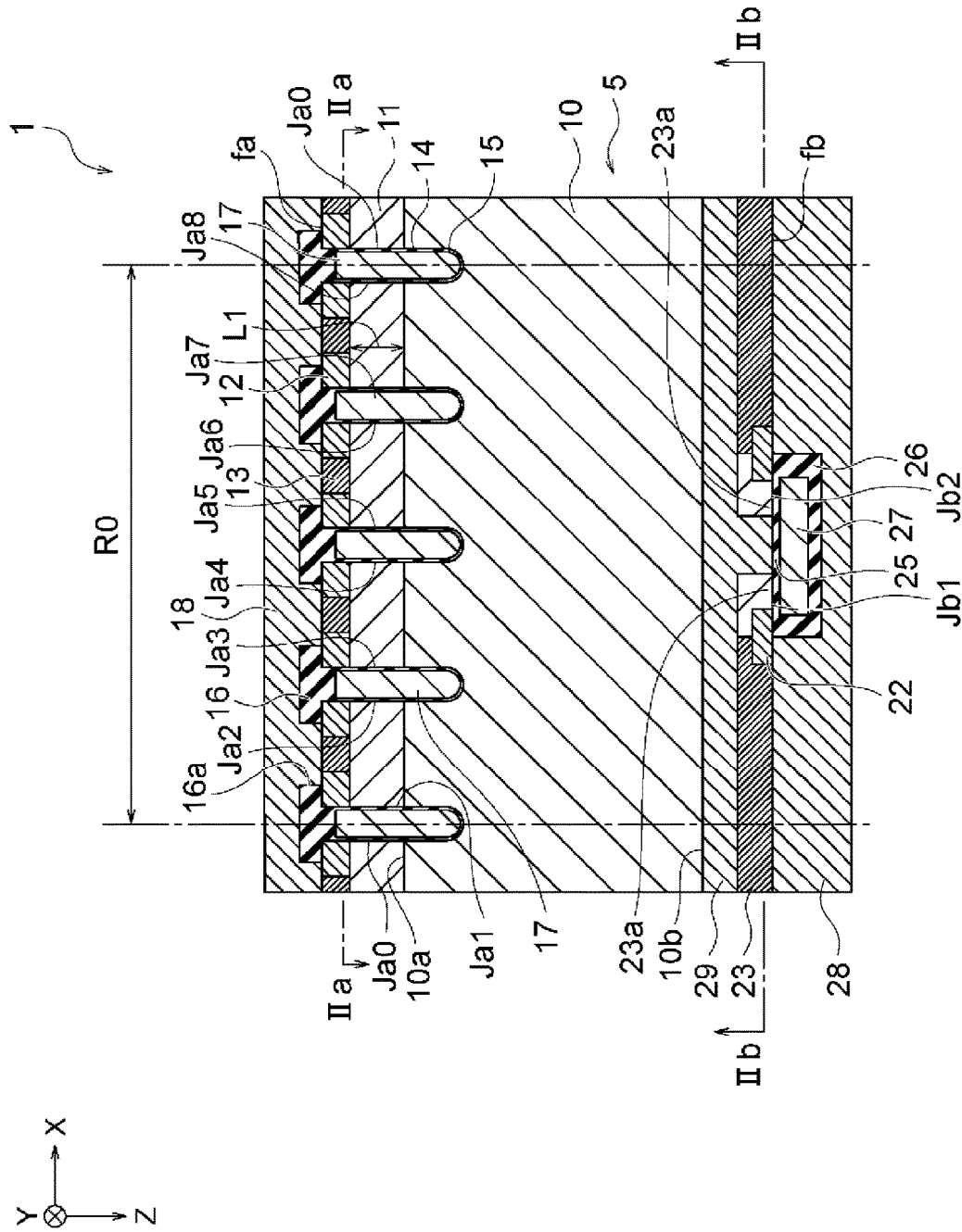
FIG. 1 is a cross-sectional view of a semiconductor device according to a first embodiment.
Figure 2A:
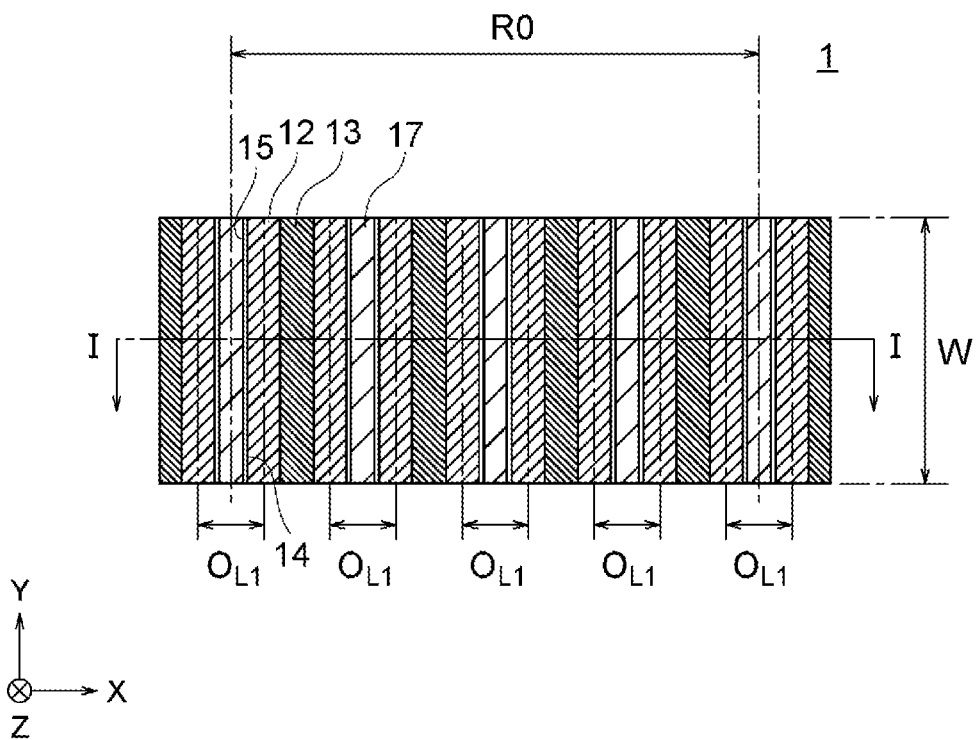
FIG. 2A is a cross-sectional view taken along line IIa-IIa in FIG. 1.
Figure 2B:
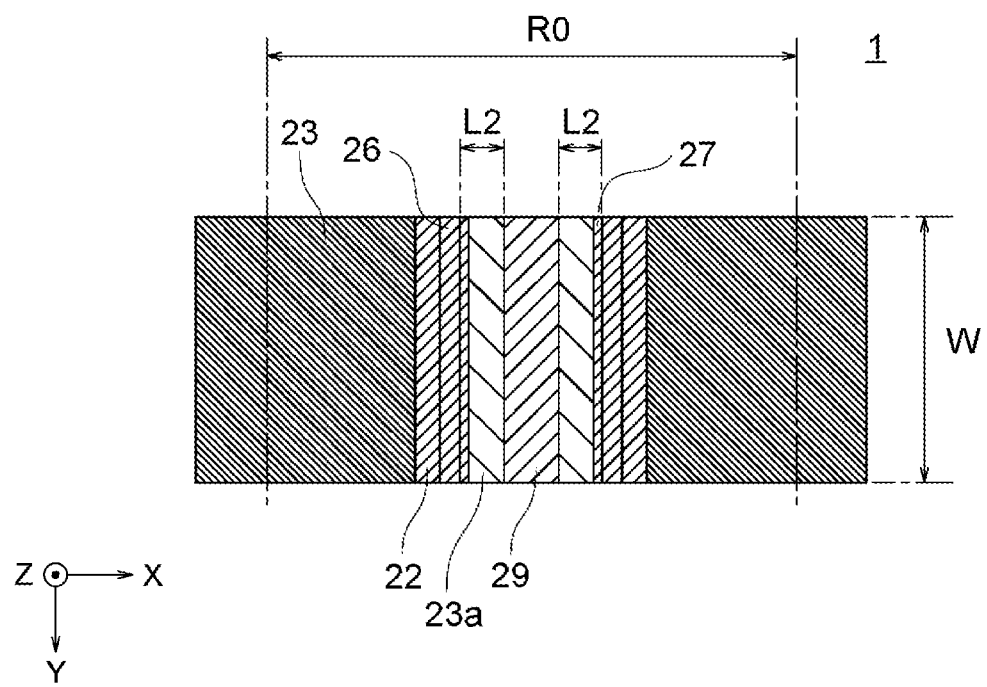
FIG. 2B is a cross-sectional view taken along line IIb-IIb in FIG. 1.

FIG. 1 is a cross-sectional view illustrating a configuration of a semiconductor device 1 according to a first embodiment. FIG. 2A is a cross-sectional view of the semiconductor device 1 illustrated in FIG. 1 when a cross-sectional portion along line IIa-IIa is viewed from above to below. FIG. 2B is a cross-sectional view of a cross-sectional portion along line IIb-IIb of the semiconductor device 1 taken along line IIb-IIb as viewed from below to above. Note that FIG. 1 illustrates a side cross-sectional configuration of the semiconductor device 1 as viewed from a position of a line I-I illustrated in FIG. 2A in a configuration in which an emitter electrode 18, a collector electrode 28, and the like described later are provided in FIGS. 2A and 2B.

In FIGS. 1, 2A, and 2B, a Z direction indicates the thickness direction of the semiconductor device 1, and an X direction indicates one direction parallel to the first surface fa of a semiconductor substrate (Hereinafter, it is simply referred to as a "substrate.") 5 of the semiconductor device 1 and a second surface fb that is the back surface thereof and a direction orthogonal to the Z direction. An Y direction is a direction parallel to a first surface fa and a second surface fb and orthogonal to the Z direction and the X direction. Note that, here, for convenience of description, in FIG. 1, the arrow direction in the Z direction which is the thickness direction is referred to as a downward direction, and the direction opposite to the arrow in the Z direction is referred to as an upward direction.

The semiconductor device 1 is an IGBT type semiconductor device, and includes, for example, the substrate 5 made of Si crystal or the like. The substrate 5 includes an emitter p⁻ layer 11 as an emitter layer, a collector p layer 23 as a collector layer, a drift layer 10 provided between the emitter p⁻ layer 11 and the collector p layer 23, an emitter n layer 12 as a first high-concentration impurity layer, an emitter p layer 13, a buffer layer 29, a collector p⁻ layer 23a, a collector n layer 22, and a second high-concentration impurity layer. In the following description, a portion on the emitter electrode 18 side with the drift layer 10 interposed therebetween will be referred to by the term "emitter-side", and a portion on the collector electrode 28 side will be referred to by the term "collector-side".

In the first embodiment, the emitter p layer 13, the emitter p⁻ layer 11, and the collector p layer 23 are impurity layers whose conductivity type is p-type (here, the first conductivity type), and the emitter n layer 12, the drift layer 10, the buffer layer 29, and the collector n layer 22 are impurity layers whose conductivity type is n-type (here, the second conductivity type).

The emitter p⁻ layer 11 is formed on the upper surface of the drift layer 10. The emitter n layer 12 and the emitter p layer 13 are formed above the emitter p⁻ layer 11. The emitter n layer 12 and the emitter p layer 13 are formed to be exposed to the first surface fa of the substrate 5, and are electrically connected to the emitter electrode 18. The emitter n layer 12, which is a first high-concentration impurity layer, is provided between the emitter electrode 18 and the emitter p⁻ layer 11. However, a part of the emitter n layer 12 may be disposed between the interlayer insulating layer 16 and the emitter p⁻ layer 11. The emitter p layer 13 is provided between the emitter electrode 18 and the emitter p⁻ layer 11. The emitter n layer 12 and the emitter p layer 13 are contact layers with respect to the emitter p⁻ layer 11 in the semiconductor device 1, and both have a higher impurity concentration than the emitter p⁻ layer 11.

The emitter n layer 12 is an n⁺ layer that injects electrons into the lower emitter p⁻ layer 11. The emitter p layer 13 is a p+ layer that discharges holes from the lower emitter p− layer 11. A trench hole 14 (described later) penetrating the emitter n layer 12 is formed in the first surface fa of the substrate 5.

The drift layer 10 is an n− layer, and has an impurity concentration of, for example, about $2 \times 10^{13}$ cm$^{-3}$. The impurity concentration of the emitter n layer 12 and the emitter p layer 13 is, for example, about $10^{18}$ to $10^{21}$ cm$^{-3}$.

As a result, the emitter n layer 12 is disposed adjacent to each trench hole 14 on the first surface fa of the substrate 5, and the emitter p layer 13 is disposed between the emitter n layers 12 formed adjacent to each trench hole 14. As illustrated in FIG. 2A, the emitter n layer 12 is formed in a band shape in top view, and is disposed on both sides of the trench hole 14 to extend in the Y direction on the first surface fa. In addition, the emitter p layer 13 is also formed in a band shape in top view, and is disposed between the emitter n layers 12 to extend in the Y direction on the first surface fa.

As illustrated in FIG. 2A, the first surface fa of the substrate 5 is provided with a plurality of trench holes 14 extending in the Y direction in the first surface fa. The trench holes 14 according to the first embodiment have the same configuration, are disposed parallel to each other along the Y direction on the first surface fa, and are provided at predetermined intervals in the X direction. As illustrated in FIG. 1, the trench hole 14 penetrates the emitter n layer 12 and the emitter p− layer 11 from the first surface fa of the substrate 5 and reaches the drift layer 10.

In each trench hole 14, a gate insulating film 15 which is an emitter-side gate insulating film is formed on an inner surface, and a trench-type emitter-side gate electrode 17 is formed in a region surrounded by the gate insulating film 15. The gate insulating film 15 is made of, for example, an oxide film, and insulates the emitter-side gate electrode 17 from the substrate 5 (the drift layer 10, the emitter p− layer 11, and the emitter n layer 12).

The emitter-side gate electrode 17 is made of, for example, polycrystalline silicon (polysilicon) or the like, and has an upper end covered with an interlayer insulating layer 16 made of an oxide film or the like. An emitter-side gate wiring (not illustrated) is connected to each emitter-side gate electrode 17, and a predetermined gate voltage Vgg1 is applied thereto via an emitter-side gate wiring. In the emitter-side gate electrode 17 according to the first embodiment, the upper end portion is positioned in the trench hole 14 without protruding from the first surface fa of the substrate 5, and the interlayer insulating layer 16 is also provided in the trench hole 14 and is connected to the gate insulating film 15.

Here, in the semiconductor device 1, as illustrated in FIGS. 1, 2A, and 2B, a predetermined number of emitter-side gate electrodes 17 extending in parallel with each other in the Y direction are arranged at predetermined intervals in the X direction. Here, the configuration in an element region R0 is one pattern, and the configuration in the element region R0 is formed at a predetermined cycle in the X direction as a repeated pattern. Hereinafter, the configuration of the semiconductor device 1 will be described focusing on the element region R0 defined in the X direction.

The emitter-side gate electrode 17 has a first facing region (hereinafter, referred to as an emitter-side facing region) disposed facing the emitter p− layer 11 via the gate insulating film 15. In FIG. 1, five emitter-side gate electrodes 17 are illustrated, and 10 emitter-side facing regions Ja0 to Ja8 are illustrated as the emitter-side facing regions Ja.

In the first embodiment, as illustrated in FIG. 1, the emitter-side facing region Ja0 on the left side in the drawing of the emitter-side gate electrode 17 at the left most end in the drawing is not included in the element region R0 that is a repeated pattern, and the emitter-side facing region Ja1 on the right side in the drawing is included in the element region R0. Further, the emitter-side facing region Ja0 on the right side of the emitter-side gate electrode 17 at the right-most end in the drawing is not included in the element region R0 that is a repeated pattern, and the emitter-side facing region Ja8 on the left side in the drawing is included in the element region R0. Therefore, in one element region R0 according to the first embodiment, a total of eight emitter-side facing regions Ja1 to Ja8 are formed as the emitter-side facing regions Ja of the emitter-side gate electrode 17. In a case where the eight emitter-side facing regions Ja1 to Ja8 are not particularly distinguished, they are simply referred to as emitter-side facing regions Ja.

As illustrated in FIG. 2A, the emitter-side gate electrode 17 according to the first embodiment is formed in a band shape in top view, and a length in the Y direction on the first surface fa of the substrate 5 (a length in the extending direction of the emitter-side gate electrode 17 in the XY plane direction) can be defined as W. The length W in the Y direction which is the extending direction is a length in the gate width direction in the emitter-side facing region Ja of the emitter-side gate electrode 17, and in the first embodiment, it is also referred to as a "first facing region length" below. In the first embodiment, the length of one emitter-side facing region Ja in the gate width direction is all W. Therefore, the total first facing region lengths of the eight emitter-side facing regions Ja1 to Ja8 in one element region R0 which is a repeated pattern in the first embodiment can be defined as 8·W.

In the first embodiment, as illustrated in FIGS. 2A and 2B, both the emitter-side gate electrode 17 and the collector-side gate electrode 27 extend in the Y direction illustrated in FIG. 1. The length L1 of the emitter-side facing region is the channel length of the emitter-side gate electrode 17 extending in the Z direction different from the Y direction. In addition, the length L2 of the collector-side facing region is the channel length of the collector-side gate electrode 27 extending in the X direction different from the Y direction.

In addition, the emitter electrode 18 made of, for example, aluminum (Al) or copper (Cu) and covering the surface of the first surface fa and the interlayer insulating layer 16 is provided on the first surface fa of the substrate 5. The emitter-side gate electrode 17 in the trench hole 14 is insulated from the emitter electrode 18 by the interlayer insulating layer 16 provided on the substrate 5.

The contact hole 16a is formed between the adjacent interlayer insulating layers 16, and the emitter electrode 18 provided on the first surface fa of the substrate 5 is also provided in the contact hole 16a. In the contact hole 16a, the emitter electrode 18 is in contact with the emitter p layer 13, and the emitter electrode 18 is electrically connected to the emitter p− layer 11 via the emitter p layer 13. The interlayer insulating layer 16 is provided on the first surface fa of the substrate 5 to cover the entire upper surface of the emitter-side gate electrode 17 and cover a partial region of the upper surface of the emitter n layer 12 adjacent to the trench hole 14.

As described above, the interlayer insulating layer 16 covers not only above the emitter-side gate electrode 17 but also the emitter n layer 12 around the emitter-side gate electrode 17, thereby preventing a short circuit between the emitter electrode 18 and the emitter-side gate electrode 17.

$O_{Z1}$ illustrated in FIG. 2A indicates a formation region of interlayer insulating layer 16 on first surface fa of substrate 5.

Next, the second surface fb side (lower surface) of the substrate 5 will be described. On the substrate 5, a buffer layer 29 is formed on the other surface 10b of the drift layer 10. A collector p layer 23, a collector p$^-$ layer 23a, and a collector n layer 22 serving as a second high-concentration impurity layer are formed below the buffer layer 29. The collector n layer 22 is an n$^+$ type impurity layer provided between the collector electrode 28 and the collector p$^-$ layer 23a and having an impurity concentration higher than that of the collector p$^-$ layer 23a. The collector n layer 22 and the collector p$^-$ layer 23a are electrically connected to the collector electrode 28.

The buffer layer 29 is between the drift layer 10 and the collector p layer 23, and has a higher impurity concentration than the drift layer 10 to prevent the depletion layer from reaching the collector p layer 23. In a case where the drift layer 10 is configured to be sufficiently thick so that the depletion layer does not reach the collector p layer 23, the buffer layer 29 may not be formed. The collector p$^-$ layer 23a is a p$^-$ layer having an impurity concentration lower than that of the collector p layer 23. The impurity concentration of the collector p layer 23 and the collector n layer 22 is, for example, about $10^{18}$ cm$^{-3}$ to $10^{21}$ cm$^{-3}$, and the impurity concentration of the buffer layer 29 is, for example, about $10^{15}$ cm$^{-3}$ to $10^{18}$ cm$^{-3}$.

The collector p$^-$ layer 23a is, for example, a p$^-$ layer having an impurity concentration lower than that of the collector p layer 23 formed by ion implantation. In the second face fb, the collector n layer 22 is formed in the collector p layer 23. The collector n layer 22 is formed in a partial region on the second face fb side of the substrate 5 across the collector p$^-$ layer 23a and the collector p layer 23.

As illustrated in FIG. 2B, the collector p layer 23 on the second surface fb of the substrate 5 is formed in a band shape in a bottom view, and is disposed so as to extend in the Y direction on the second surface fb. In addition, on both sides of the collector p layer 23, the collector p$^-$ layer 23a and the collector n layer 22 formed in a band shape are arranged in this order in a bottom view, and the collector p$^-$ layer 23a and the collector n layer 22 are arranged so as to extend in the Y direction on the second surface fb.

In addition to such a configuration, as illustrated in FIG. 1, a planar collector-side gate electrode 27, a gate insulating film 25 which is a collector-side gate insulating film formed on the upper surface of the collector-side gate electrode 27, and a collector electrode 28 are provided on the second face fb of the substrate 5. The planar collector-side gate electrode 27 disposed on the surface of the second face fb (the X-Y plane of the second face fb) of the substrate 5 via the gate insulating film 25 is made of, for example, polycrystalline silicon (polysilicon) or the like, and is disposed below the collector p layer 23 and the collector p$^-$ layer 23a via the gate insulating film 25 made of an oxide film or the like. A collector-side gate wiring (not illustrated) is connected to the collector-side gate electrode 27, and a predetermined gate voltage Vgg2 is applied thereto via the collector-side gate wiring.

The collector-side gate electrode 27 has a second facing region (hereinafter, referred to as collector-side facing region) Jb disposed facing the collector p$^-$ layer 23a of the second face fb with the gate insulating film 25 interposed therebetween. In FIG. 1, one collector-side gate electrode 27 is provided in the element region R0 as a repetitive pattern, and two collector-side facing regions Jb1 and Jb2 are provided in the element region R0. Note that the two collector-side facing regions Jb1 and Jb2 will be simply referred to as collector-side facing regions Jb unless otherwise distinguished.

As shown in FIG. 2B, the collector-side gate electrode 27 according to the first embodiment is formed in a band shape in a bottom view, and a length in the Y direction (a length in an extending direction of the collector-side gate electrode 27 in the X-Y plane direction) of the second surface fb of the substrate 5 can be defined as W. The length W in the Y direction which is the extending direction is a length in the gate width direction in the collector-side facing region Jb of the collector-side gate electrode 27, and in the first embodiment, it is also referred to as a "second facing region length" below. Therefore, the total of the second facing region lengths of the two collector-side facing regions Jb1 and Jb2 in one element region R0 to be a repeated pattern in the first embodiment can be defined as 2·W.

The gate insulating film 25 provided on the second face fb of the substrate 5 is disposed on the collector-side gate electrode 27, and the interlayer insulating layer 26 is formed below and on the side of the collector-side gate electrode 27. The collector-side gate electrode 27 is entirely covered with the gate insulating film 25 and the interlayer insulating layer 26. In addition, the second face fb of the substrate 5 is provided with a collector electrode 28 made of, for example, aluminum (Al) or copper (Cu) and covering the surface of the second face fb and the interlayer insulating layer 26. The collector electrode 28 is adjacent to the collector n layer 22 and the collector p layer 23, and is electrically connected to the collector n layer 22 and the collector p layer 23. The collector-side gate electrode 27 is insulated from the buffer layer 29 and the collector p$^-$ layer 23a by a gate insulating film 25 provided on the second surface fb of the substrate 5.

Here, in one element region R0 that becomes a repeated pattern in the first embodiment, the total length of the first facing regions of the emitter-side facing regions Ja1 to Ja8 is defined as 8 W, and is configured to be longer than 2 W that is the total length of the second facing regions of the collector-side facing regions Jb1 and Jb2.

In the first embodiment, since the length of one first facing region of the emitter-side gate electrode 17 is equal to the length of one second facing region of the collector-side gate electrode 27, in order to make the total length of the first facing region longer than the total length of the second facing region in the element region R0, the emitter-side gate electrode 17 of the first surface fa is arranged with higher density than the collector-side gate electrode 27 of the second surface fb. In the first embodiment, a ratio between the total length of the first facing region and the total length of the second facing region in the element region R0 when the total length of the second facing region in the element region R0 is 1 is referred to as a gate density ratio.

In the semiconductor device 1 according to the first embodiment, the gate density ratio Ja:Jb is 4:1, that is, the total length of the first facing region is four times the total of the second facing region lengths. In the present embodiment, the case where the total of the first facing region lengths is four times the total of the second facing region lengths has been described. However, the present invention is not limited to this, and the total of the first facing region lengths may be longer than the total of the second facing region lengths. For example, the total of the first facing regions may be longer than or equal to twice the total of the second facing region lengths, or may be longer than or equal to four times the total of the second facing region lengths.

The gate density ratio Ja:Jb is desirably more than 1:1 to less than 8:1. In addition, the gate density ratio Ja:Jb is preferably in a range of 2:1 to 7:1, and more preferably in a range of 3:1 to 5:1. It has been confirmed from the simulation results that by setting the gate density ratio Ja:Jb as described above, the switching loss at the time of turn-off can be reduced while suppressing the loss at the time of conduction at the time of on/off operation of the semiconductor device 1, and details thereof will be described later.

As described above, in the first embodiment, the total first facing region length and the total second facing region length in the element region R0 are compared to adjust the conduction loss and the switching loss. This is performed to adjust the driving force between the first surface fa (upper surface) and the second surface fb (lower surface) of the semiconductor device 1, focusing on the fact that the driving force of the semiconductor device is proportional to the gate width of the gate electrode. In addition, the driving force increases as the gate length decreases, but the influence on the driving force due to the difference in the lengths L1 and L2 with respect to the gate length can be ignored because it is sufficiently smaller than the gate width W. However, in the first embodiment, in addition to the adjustment by the total of the first facing region lengths and the total of the second facing region lengths, the length L1 and the length L2 illustrated in FIGS. 1, 2A, and 2B may be designed to be longer or shorter, and the driving force may be further adjusted between the emitter side and the collector side.

(On-Off Operation of Semiconductor Device)

Next, the on/off operation of the semiconductor device 1 described above will be described. In the semiconductor device 1, a positive voltage Vce is applied between the emitter electrode 18 and the collector electrode 28. The semiconductor device 1 is controlled by application states of a gate voltage Vgg1 which is a first gate voltage applied to the emitter-side gate electrode 17 and a gate voltage Vgg2 which is a second gate voltage applied to the collector-side gate electrode 27. When the semiconductor device 1 is in an ON state, conduction is established between the emitter n layer 12 and the drift layer 10, and non-conduction is established between the collector n layer 22 and the drift layer 10. At this time, electrons are injected from the emitter electrode 18 into the drift layer 10 via the inversion layer formed in the emitter p⁻ layer 11, and holes are injected from the collector p layer 23 into the drift layer 10. In addition, at the time of turn-off for switching the semiconductor device 1 to the OFF state, at least the collector n layer 22 and the drift layer 10 are electrically connected. At this time, electrons are discharged from the drift layer 10 to the collector electrode 28 via the inversion layer formed in the collector p⁻ layer 23a and the collector n layer 22. If the emitter n layer 12 and the drift layer 10 are made non-conductive at the timing when the collector n layer 22 and the drift layer 10 are conductive, injection of electrons into the drift layer 10 is stopped, and holes are discharged from the drift layer 10 to the emitter p⁻ layer 11. Hereinafter, the ON operation and the OFF operation will be described in detail.

Figure 3:
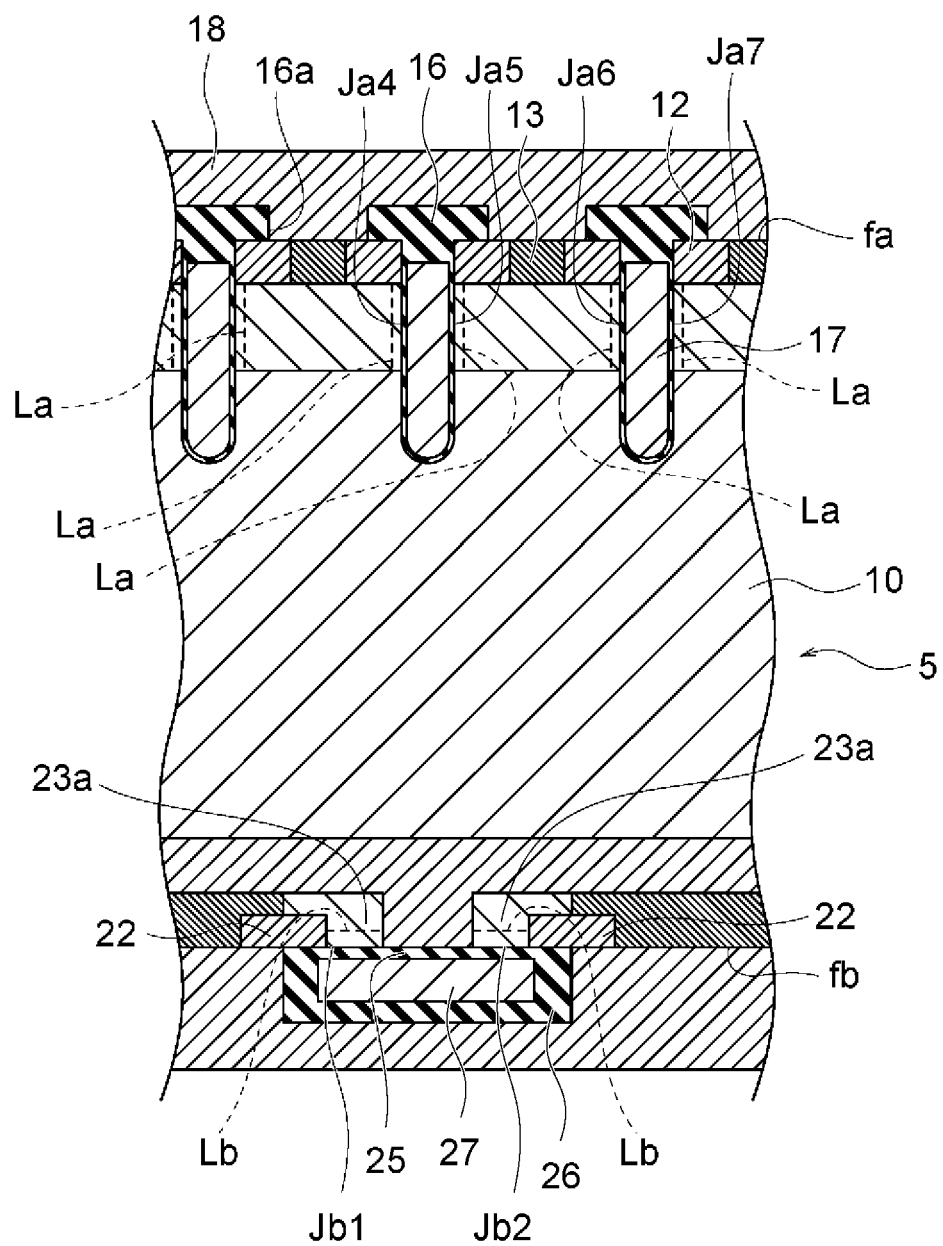
FIG. 3 is a schematic diagram for illustrating an inversion layer formed in an emitter $p^-$ layer and an inversion layer formed in a collector $p^-$ layer.

During the ON operation, a high (for example, greater than or equal to a threshold value) gate voltage Vgg1 (ON voltage) is applied to the emitter-side gate electrode 17, and a low (for example, 0 V) gate voltage Vgg2 (OFF voltage) is applied to the collector-side gate electrode 27. As a result, in the semiconductor device 1, as illustrated in FIG. 3, an inversion layer (n channel) La is formed in the emitter p⁻ layer 11 along the emitter-side facing region Ja.

During the ON operation, in the semiconductor device 1, the inversion layer La establishes conduction between the emitter n layer 12 and the drift layer 10, and electrons are injected from the emitter n layer 12 to the drift layer 10 via the inversion layer La. The ON voltage applied to the emitter-side gate electrode 17 may be a positive voltage with respect to the emitter electrode 18.

In addition, in the semiconductor device 1, when a low (for example, 0 V) gate voltage Vgg2 (OFF voltage) different from the gate voltage Vgg1 is applied to the collector-side gate electrode 27, the inversion layer Lb (n channel) is not formed in the collector p⁻ layer 23a along the collector-side facing region Jb of the collector-side gate electrode 27 facing the collector p⁻ layer 23a via the gate insulating film 25. Therefore, in the semiconductor device 1, the collector n layer 22 and the buffer layer 29 are insulated and brought into a non-conductive state, and the pn junction formed by the collector p layer 23 and the buffer layer 29 is forward-biased. In the semiconductor device 1, holes are injected from the collector p layer 23 to the drift layer 10 via the buffer layer 29 by forward bias of a pn junction formed by the collector p layer 23 and the buffer layer 29. Here, since the collector n layer 22 and the drift layer 10 are electrically connected via the buffer layer 29, conduction and non-conduction between the collector n layer 22 and the buffer layer 29 are synonymous with conduction and non-conduction between the collector n layer 22 and the drift layer 10.

The gate voltage Vgg2 different from the gate voltage Vgg1 described above is not limited to 0 V, and may be, for example, a negative voltage or a positive voltage to the extent that an inversion layer is not formed under the collector-side gate electrode 27. That is, the gate voltage Vgg1 and the gate voltage Vgg2 applied at the same time may be any voltages as long as the inversion layer is formed in one of the facing regions on the emitter side and the collector side and the inversion layer is not formed in the other facing region.

As described above, during the ON operation, the density of electrons and holes existing in the drift layer 10 increases, so that conductivity modulation occurs and the resistance of the drift layer 10 decreases. Note that the ON voltage of the semiconductor device 1 corresponds to a voltage drop during the on-state between the collector electrode 28 and the emitter electrode 18.

Next, an OFF operation for switching the semiconductor device 1 from the ON state to the OFF state will be described. In this case, in the semiconductor device 1, the low gate voltage Vgg1 is applied as the OFF voltage to the emitter-side gate electrode 17, and the high gate voltage Vgg2 is applied as the ON voltage to the collector-side gate electrode 27. As a result, in the semiconductor device 1, the inversion layer (n channel) La formed in the emitter p⁻ layer 11 along the emitter-side facing region Ja is not formed, and the emitter n layer 12 and the drift layer 10 are nonconductive. As a result, in the semiconductor device 1, injection of electrons from the emitter n layer 12 to the drift layer 10 is stopped due to disappearance of the inversion layer during the OFF operation. The ON voltage applied to the collector-side gate electrode 27 may be a positive voltage with respect to the collector electrode 28.

In addition, as illustrated in FIG. 3, during the OFF operation, in the semiconductor device 1, the high gate voltage Vgg2 is applied to the collector-side gate electrode 27, the inversion layer Lb is formed in the collector p⁻ layer 23a along the collector-side facing region Jb. The buffer layer 29 and the collector p layer 23 have the same potential through the inversion layer Lb, and injection of holes from the collector p layer 23 to the drift layer 10 is stopped around the collector-side gate electrode 27b.

The electrons accumulated in the drift layer 10 are discharged from the buffer layer 29 to the collector n layer 22 via the inversion layer Lb, and further discharged from the collector n layer 22 to the collector electrode 28. Holes in the drift layer 10 are discharged to the emitter electrode 18 via the emitter p⁻ layer 11 and the emitter p layer 13. Further, the pn junction between the emitter p⁻ layer 11 and the drift layer 10 is depleted, and the semiconductor device 1 is turned off.

As described above, the inversion layer La formed in the emitter p⁻ layer 11 during the ON operation of the semiconductor device 1 is formed in the emitter p⁻ layer 11 along the emitter-side facing region Ja. The inversion layer Lb formed in the collector p⁻ layer 23a during the ON operation of the semiconductor device 1 is formed in the collector p⁻ layer 23a along the collector-side facing region Jb.

Here, in the first embodiment, in one element region R0 to be a repeated pattern, the total length of the first facing regions of the emitter-side facing regions Ja1 to Ja8 is configured to be longer than the total length of the second facing regions of the collector-side facing regions Jb1 and Jb2. Therefore, in the semiconductor device 1, in the element region R0, the total length in the gate width direction of the inversion layer La formed along the emitter-side facing region Ja during the ON operation can be made longer than the total length in the gate width direction of the inversion layer Lb formed along the collector-side facing region Jb in the collector p⁻ layer 23a during the OFF operation.

The semiconductor device 1 is configured such that the total of the lengths in the gate width direction of the inversion layer La in the emitter p⁻ layer 11 is longer than the total of the lengths in the gate width direction of the inversion layer Lb in the collector p⁻ layer 23a by making the total length in the first facing region of the emitter-side facing region Ja longer than the total length in the second facing region of the collector-side facing region Jb in the element region R0 (that is, the value of Ja of the gate density ratio Ja:Jb is made larger than the value of Jb), and as a result, the switching loss at the time of turn-off is reduced while suppressing the conduction loss.

(Simulation Results)

Figure 4B:
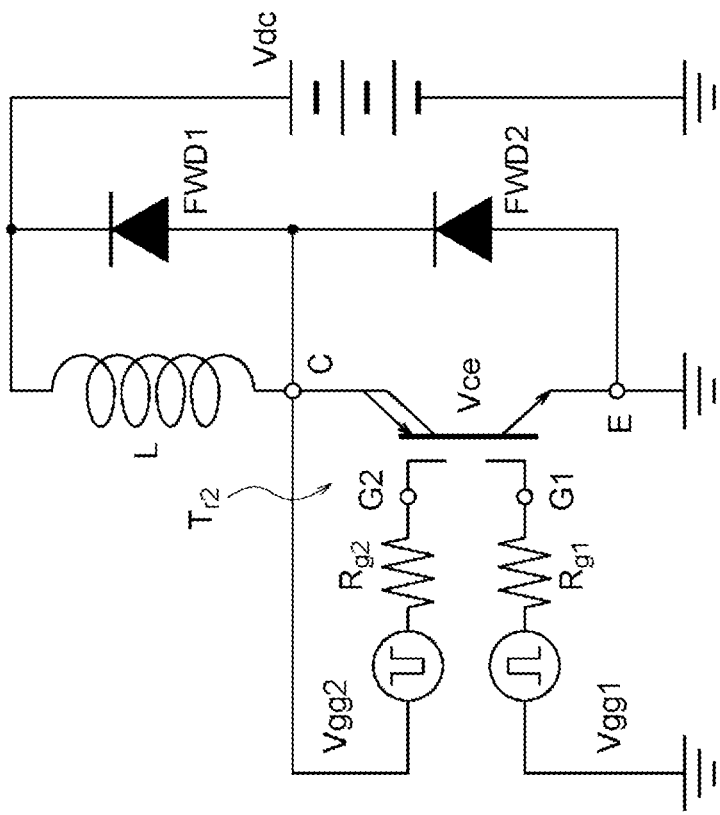
FIG. 4B is a circuit diagram illustrating an evaluation circuit of the semiconductor device according to the first embodiment.
Figure 4A:
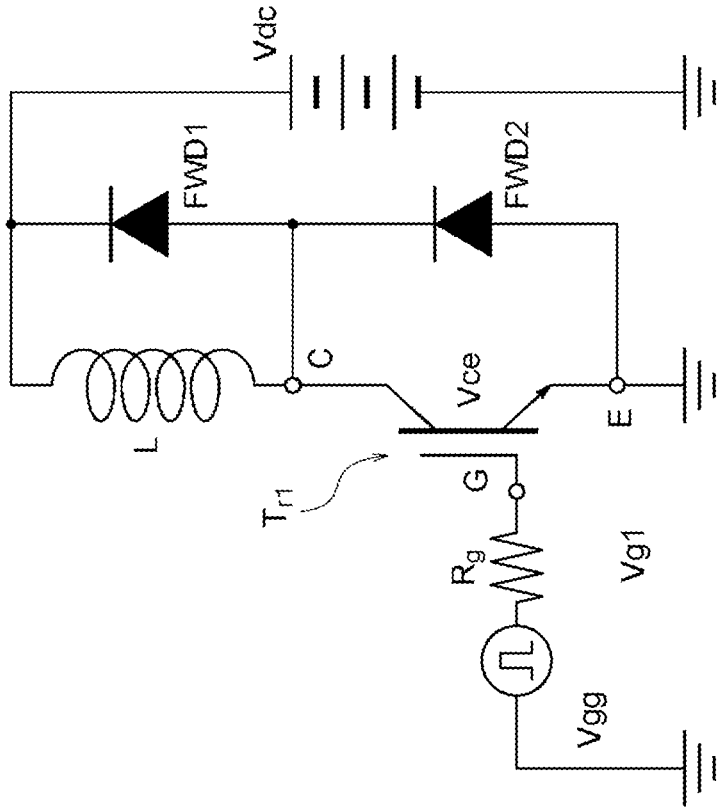
FIG. 4A is a circuit diagram illustrating an evaluation circuit of a conventional IGBT as a comparative example.

Next, in the semiconductor device 1 as described above, the relationship between the conduction loss and the switching loss when the gate density ratio Ja:Jb was changed was examined by simulation. Here, FIGS. 4A and 4B illustrate evaluation circuits used for simulation. The evaluation circuit illustrated in FIG. 4A is a comparative example, and illustrates a circuit configuration of an IGBT on one side in which the emitter-side gate electrode 17 is provided and the collector-side gate electrode 27 is not provided. The evaluation circuit illustrated in FIG. 4B illustrates a circuit configuration of the semiconductor device 1 according to the first embodiment.

In the evaluation circuit of the comparative example of FIG. 4A, an inductance L serving as a load and a diode Free Wheeling Diode 1 (FWD) are connected in parallel, and an IGBT unit $T_{r1}$ and a diode FWD2 are connected in parallel. The FWD 1 and the FWD 2 are devices that return the energy stored in the inductance L to the power supply Vdc side when the IGBT unit $T_{r1}$ is turned off. A power supply Vdc is connected to the inductance L and one end of the diode FWD1.

The IGBT unit $T_{r1}$ has a gate terminal G corresponding to the emitter-side gate electrode 17, a collector terminal C corresponding to the collector electrode 28, and an emitter terminal E corresponding to the emitter electrode 18, and a pulse voltage for turning on or off the gate is applied as a gate voltage Vgg1 to the gate terminal G via a resistor $R_g$. The inductance L and the other end of the diode FWD1 are connected to the collector terminal C, and one end of the diode FWD1 is connected to the collector terminal C. The other end of the diode FWD2 and the ground are connected to the emitter terminal E. Vce represents a voltage between the emitter terminal E and the collector terminal C.

In the evaluation circuit illustrated, configurations of the evaluation circuit in FIG. 4A and an IGBT unit $T_{r2}$ in FIG. 4B are changed. Other configurations are the same as those of the evaluation circuit of FIG. 4A, and thus, description thereof is omitted. The IGBT unit $T_{r2}$ is provided with an emitter-side gate terminal G1 corresponding to the emitter-side gate electrode 17 and a collector-side gate terminal G2 corresponding to the collector-side gate electrode 27. The collector-side gate terminal G2 is connected to the collector terminal C via the resistor Rg or the like. In the simulation, the application of the gate voltage Vgg1 to the emitter-side gate terminal G1 via a resistor $R_{g1}$ and the application of the gate voltage Vgg2 to the collector-side gate terminal G2 via a resistor $R_{g2}$ were alternately performed.

Then, in the evaluation circuit illustrated in FIG. 4B, the relationship between the conduction loss and the switching loss was examined by simulation when the gate density ratio Ja:Jb was 1:1, 2:1, 4:1, and 8:1. As a result, results as illustrated in FIGS. 5A and 5B were obtained.

Figure 5A:
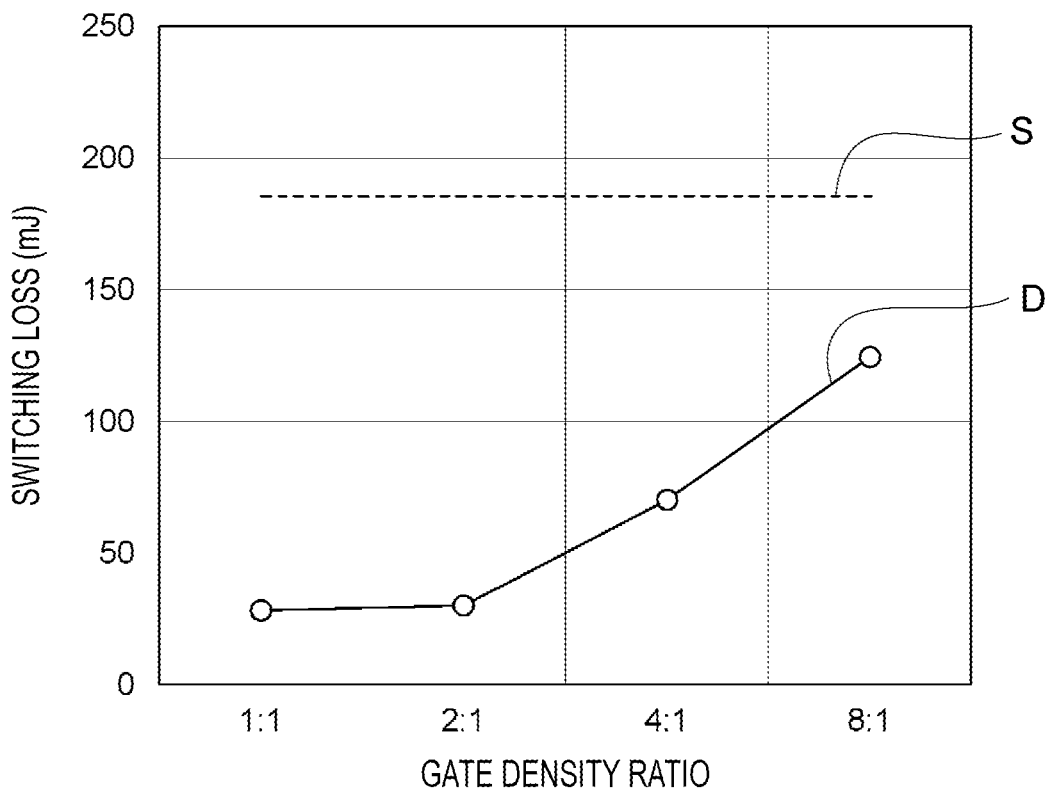
FIG. 5A is a graph illustrating a simulation result illustrating a relationship between a gate density ratio and a switching loss.
Figure 5B:
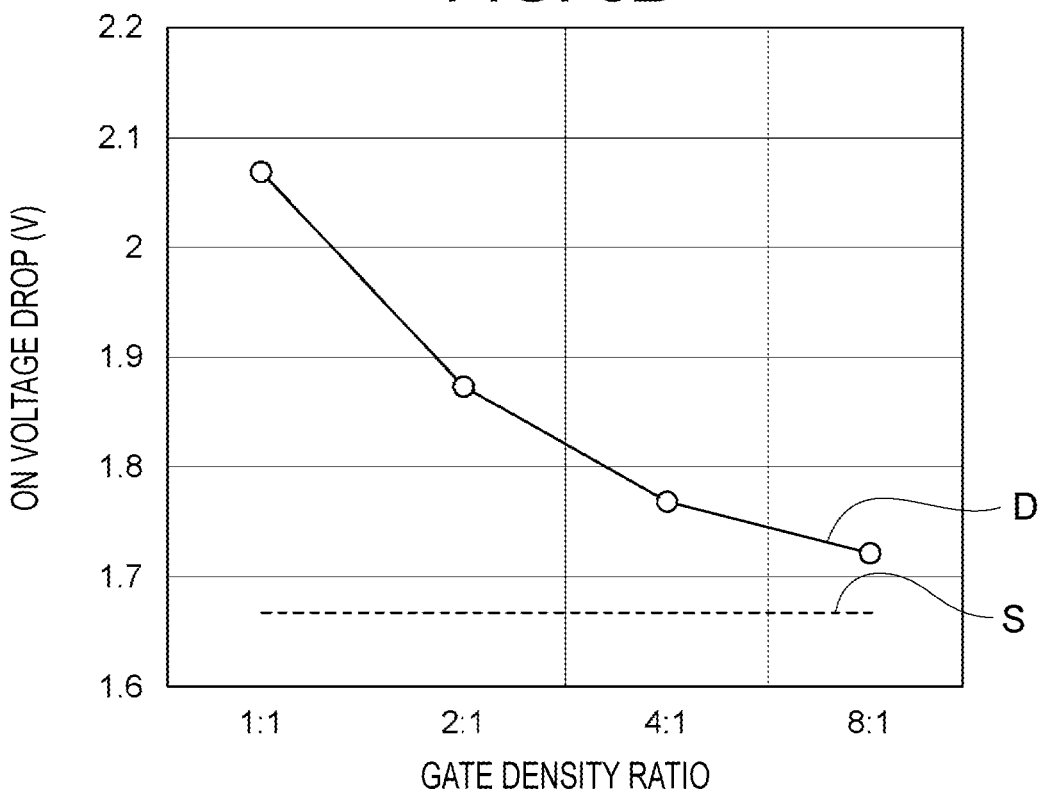
FIG. 5B is a graph illustrating a simulation result illustrating a relationship between a gate density ratio and an ON voltage drop.

FIGS. 5A and 5B are diagrams for illustrating the influence of the gate density ratio between the emitter side and the collector side on the semiconductor device 1. FIG. 5A is a diagram illustrating a simulation result of examining the relationship between the gate density ratio Ja:Jb and the switching loss. In FIG. 5A, the horizontal axis represents the gate density ratio, and the vertical axis represents the minimum value (mJ) of the switching loss in FIG. 6. The switching loss is energy consumed by one switching, and decreases as a voltage is applied to the semiconductor device 1 due to abrupt switching and a time during which a current flows is shortened. The switching frequency can be increased by reducing the FIG. 5B is a diagram illustrating a simulation result of examining the relationship between the gate density ratio Ja:Jb and the ON voltage drop. In FIG. 5B, the horizontal axis represents the gate density ratio, and the vertical axis represents the ON voltage drop (V). The ON voltage drop is a physical quantity related to a conduction loss of the IGBT, and indicates that the smaller the ON voltage drop, the smaller the conduction loss.

S illustrated in FIGS. 5A and 5B illustrates simulation results in the evaluation circuit of FIG. 4A in which the gate electrode is provided only on one surface of the substrate 5. In addition, D illustrated in FIGS. 5A and 5B illustrates a simulation result of an evaluation circuit having gate electrodes on both surfaces of the substrate 5 illustrated in FIG. 4B.

As illustrated in FIG. 5A, in the comparative example, the switching loss was about 185 mJ. On the other hand, as indicated by the solid line D, in the evaluation circuit illustrating the semiconductor device 1 of the first embodiment, the switching loss was about 27 mJ when the gate density ratio was 1:1, and the switching loss was about 30 mJ when the gate density ratio was 2:1.

Further, in a case where the value of the emitter-side facing region Ja at the gate density ratio Ja:Jb was increased by changing the parameters of the evaluation circuit illustrated in FIG. 4B, the switching loss increased. When the gate density ratio was 4:1, the switching loss was about 68 mJ, and when the gate density ratio was 8:1, the switching loss was about 122 mJ. From the results shown in FIG. 5A, it has been confirmed that the switching loss is smaller in the evaluation circuit showing the semiconductor device 1 according to the first embodiment than in the comparative example regardless of the gate density ratio.

However, it has been confirmed that the switching loss gradually increases as the value of the emitter-side facing region Ja in the gate density ratio Ja:Jb is increased. Therefore, in order to reduce the switching loss, it has been confirmed that it is desirable to reduce the total length in the gate width direction of the emitter-side gate electrode 17 of the evaluation circuit, that is, to reduce the value of the emitter-side facing region Ja in the gate density ratio Ja:Jb.

It is considered that the above characteristics are caused by the fact that the value of Ja in the gate density ratio Ja:Jb, that is, the total length of the emitter-side facing region Ja in the gate width direction is shortened, in other words, the total length of the collector-side facing region Jb in the gate width direction is made relatively long, so that the effect of discharging electrons from the drift layer 10 is enhanced, and the loss is reduced by increasing the switching speed.

As illustrated in FIG. 5B, the ON voltage drop of the comparative example was about 1.66 V. On the other hand, in the evaluation circuit showing the semiconductor device 1 of the first embodiment, the ON voltage drop is about 2.06 V when the gate density ratio is 1:1, and the ON voltage drop is about 1.86 V when the gate density ratio is 2:1.

Further, when the value of the emitter-side facing region Ja in the gate density ratio Ja:Jb was increased by changing the parameter of the evaluation circuit shown in FIG. 4B, the ON voltage drop decreased, the ON voltage drop was about 1.77 V when the gate density ratio was 4:1, and the ON voltage drop was about 1.72 V when the gate density ratio was 8:1. From the results illustrated in FIG. 5B, it has been confirmed that the evaluation circuit showing the semiconductor device 1 according to the first embodiment has a larger ON voltage drop than that of the comparative example regardless of the gate density ratio.

Then, it has been confirmed that the ON voltage drop gradually increases as the value of the emitter-side facing region Ja in the emitter-side gate density ratio Ja:Jb of the evaluation circuit decreases. Therefore, it has been confirmed that it is desirable to increase the value of the emitter-side facing region Ja in the gate density ratio Ja:Jb in order to reduce the ON voltage drop.

It is considered that the above characteristics are caused by decreasing the value of the collector-side facing region Jb with respect to the emitter-side facing region Ja in the gate density ratio Ja:Jb, that is, relatively increasing the ratio of the region of the collector p layer 23 that contributes to hole emission. This is because, when the value of Jb in the gate density ratio Ja:Jb, that is, the total length of the collector-side facing region Jb in the gate width direction increases, the hole injection area on the collector side decreases and the resistance of the drift layer 10 increases.

From the above simulation results, it has been confirmed that there is a trade-off relationship between the reduction of the conduction loss and the reduction of the switching loss. In the gate density ratio Ja:Jb, it has been confirmed that there is a condition that the switching loss at the time of turn-off can be reduced while suppressing the conduction loss by increasing the ratio of the emitter-side facing region Ja to the collector-side facing region Jb.

Specifically, from the above simulation results, in order to reduce the switching loss at the time of turn-off while suppressing the conduction loss at the time of on/off operation of the semiconductor device 1, it has been confirmed that it is desirable to set the gate density ratio Ja:Jb to be more than 1:1 to less than 8:1, preferably to set the gate density ratio Ja:Jb to be in the range of 2:1 to 7:1, and more preferably to be in the range of 3:1 to 5:1.

Next, when the gate density ratio Ja:Jb is changed in the evaluation circuit of the semiconductor device 1 shown in FIG. 4B and the evaluation circuit of the semiconductor device 1 is switched from the ON state to the OFF state, the switching loss when the timing of applying the OFF voltage to the emitter-side gate terminal G1 and the timing of applying the ON voltage to the collector-side gate terminal G2 are shifted is examined by simulation. As a result, simulation results as illustrated in FIG. 6 were obtained.

Figure 6:
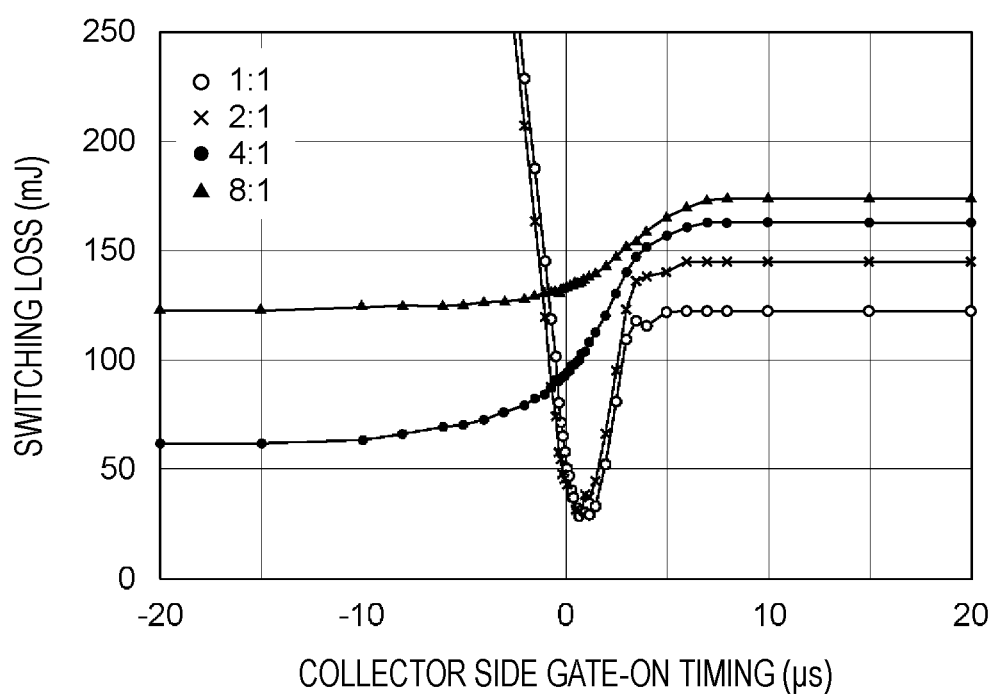
FIG. 6 is a graph showing a simulation result illustrating a relationship between a shift of gate-on timings on an emitter side and a collector side and a switching loss.

In FIG. 6, the vertical axis represents the switching loss (mJ), and the horizontal axis represents the collector-side gate-on timing (μs). The collector-side gate-on timing indicates the timing of applying the ON voltage to the collector-side gate terminal G2 with reference to the timing of applying the OFF voltage to the emitter-side gate terminal G1. A negative value on the horizontal axis indicates that the timing of applying the ON voltage to the collector-side gate terminal G2 is earlier than the timing of applying the OFF voltage to the emitter-side gate terminal G1. A positive value on the horizontal axis indicates that the timing of applying the ON voltage to the collector-side gate terminal G2 is later than the timing of applying the OFF voltage to the emitter-side gate terminal G1.

From the simulation results of FIG. 6, it has been confirmed that when the gate density ratio Ja:Jb is 1:1 and 2:1, the switching loss rapidly increases when the timing of applying the ON voltage to the collector-side gate terminal G2 is earlier than the timing of applying the OFF voltage to the emitter-side gate terminal G1. Such a phenomenon is considered to occur because carriers in the drift layer 10 are rapidly reduced by applying an ON voltage to the collector-side gate terminal G2, and the semiconductor device 1 is driven in a high resistance state.

On the other hand, when the gate density ratio Ja:Jb is 4:1 or 8:1, it has been confirmed that no abrupt switching loss occurs even when the timing of applying the ON voltage to the collector-side gate terminal G2 is earlier than the timing of applying the OFF voltage to the emitter-side gate terminal G1. The reason for this is considered to be that, when the total length of the collector-side facing region Jb in the gate width direction is shorter than the total length of the emitter-side facing region Ja in the gate width direction, a hole injection suppression effect sufficient to stop conductivity modulation cannot be obtained, and even if the gate voltage Vgg2 is turned on earlier than the gate voltage Vgg1, hole injection into the drift layer 10 is not completely stopped, and it is possible to avoid occurrence of a large switching loss due to an extreme increase in the resistance of the drift layer 10.

From the above simulation results, it has been confirmed that by setting the gate density ratio Ja:Jb to be more than 2:1, even if the timing of applying the ON voltage to the collector-side gate electrode 27 (collector-side gate terminal G2) deviates from the timing of applying the OFF voltage to the emitter-side gate electrode 17 (emitter-side gate terminal G1), occurrence of a rapid switching loss can be suppressed.

(Manufacturing Method)

Next, a method for manufacturing the semiconductor device 1 according to the first embodiment will be described.

Figure 7A:
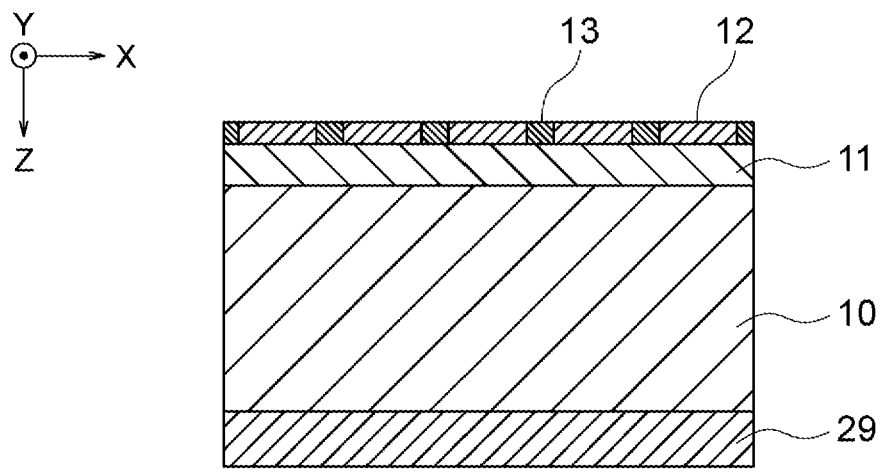
FIG. 7A, FIG. 7B, and FIG. 7C are diagrams for illustrating a manufacturing process of the semiconductor device of the first embodiment.
Figure 7B:
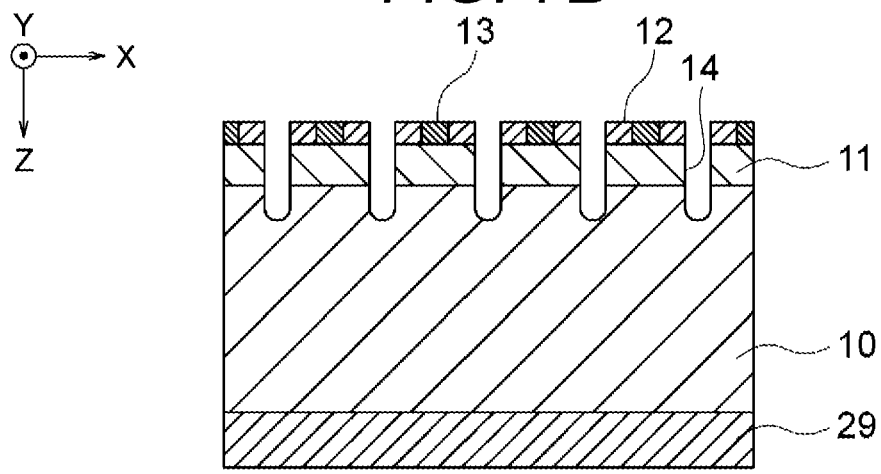
Figure 7C:
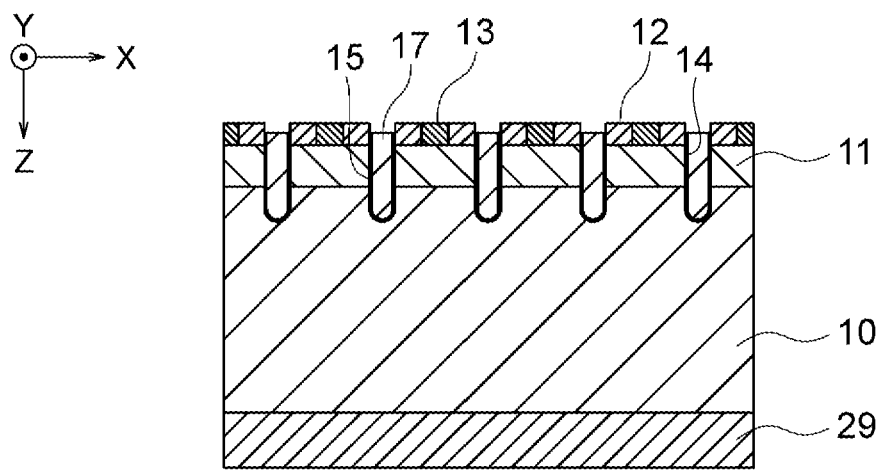
Figure 7D:
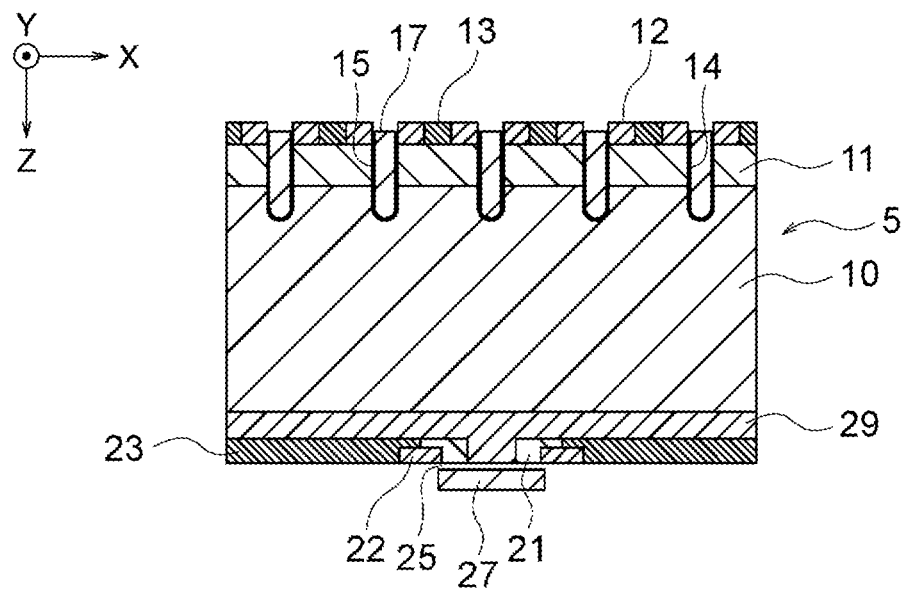
FIG. 7D and FIG. 7E are diagrams for illustrating a manufacturing process of the semiconductor device of the first embodiment subsequent to FIGS. 7A to 7C.

FIGS. 7A to 7C, 7D, and 7E are diagrams for illustrating an example of a manufacturing method for manufacturing the semiconductor device 1 of the first embodiment. In the first embodiment, impurities are implanted into a bare substrate made of single crystal silicon to form a substrate having the drift layer 10, and impurities are sequentially implanted into the substrate to form the substrate 5 (FIG. 7D). Among the impurity layers illustrated in FIG. 7A, the emitter p⁻ layer 11 is a p⁻ layer having a relatively low impurity concentration. The emitter n layer 12 is an n⁺ layer having a relatively high concentration with respect to the emitter p⁻ layer 11. The emitter p layer 13 is a p⁺ layer having a relatively high concentration with respect to the emitter p⁻ layer 11. The buffer layer 29 is an n layer having a relatively high concentration with respect to the drift layer 10. The emitter p⁻ layer 11, the emitter n layer 12, the emitter p layer 13, the collector p layer 23, and the buffer layer 29 can be formed by, for example, ion implantation.

Next, in the first embodiment, as illustrated in FIG. 7B, the trench hole 14 that penetrates the emitter p⁻ layer 11 from the emitter n layer 12 of the first surface fa and reaches the drift layer 10 is formed. The formation of the trench holes 14 can be performed by photolithography. Next, the gate insulating film 15 is formed on the inner surface of the trench hole 14. The formation of the gate insulating film 15 is performed by forming an insulating film on the entire surface of the wafer in the state illustrated in FIG. 7B.

Next, in the first embodiment, as illustrated in FIG. 7C, polysilicon is filled from above the gate insulating film 15 of the trench hole 14, and the emitter-side gate electrode 17 is formed in the trench hole 14.

Next, in the first embodiment, as illustrated in FIG. 7D, after the layered gate insulating film 25 is formed on the back surface of the buffer layer 29, polysilicon is deposited, and the gate insulating film 25 is etched by photolithography, and the planar collector-side gate electrode 27 is formed on the back surface of the buffer layer 29 via the gate insulating film 25. Then, a p-type impurity is implanted into the back surface of the buffer layer 29 using the collector-side gate electrode 27 as a mask, and the collector p layer 23 having the collector p⁻ layer 23a on the back surface of the buffer layer 29 is formed by, for example, ion implantation. Further, n-type impurities are implanted into the collector p layer 23 at a high concentration, and the collector n layer 22 is formed from the collector p layer 23 around the collector-side gate electrode 27 to the collector p⁻ layer 23a. Through the above processes, the substrate 5 is completed.

Figure 7E:
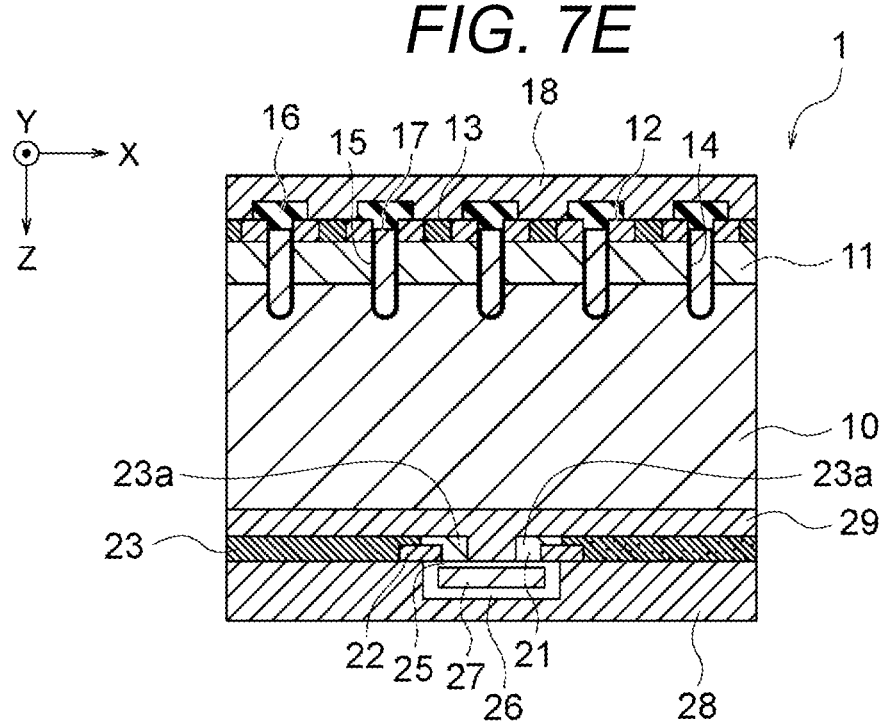

After the above processes, as illustrated in FIG. 7E, the interlayer insulating layer 16 is formed on the emitter-side gate electrode 17, a contact hole is formed by photolithography, and metal is deposited on the first surface fa of the substrate 5 to form the emitter electrode 18. Similarly, the interlayer insulating layer 26 is formed around the collector-side gate electrode 27, a contact hole is formed by photolithography, and metal is deposited on the second surface fb of the substrate 5 to form the collector electrode 28.

As described above, the semiconductor device 1 of the first embodiment can be manufactured. However, the semiconductor device 1 is not manufactured only by the method described above. The method and conditions of the manufacturing process are appropriately selected according to the design of the semiconductor device 1 and the required conditions.

Modification Example

Next, modification examples of the first embodiment described above will be described.

First Modification Example

Figure 8:
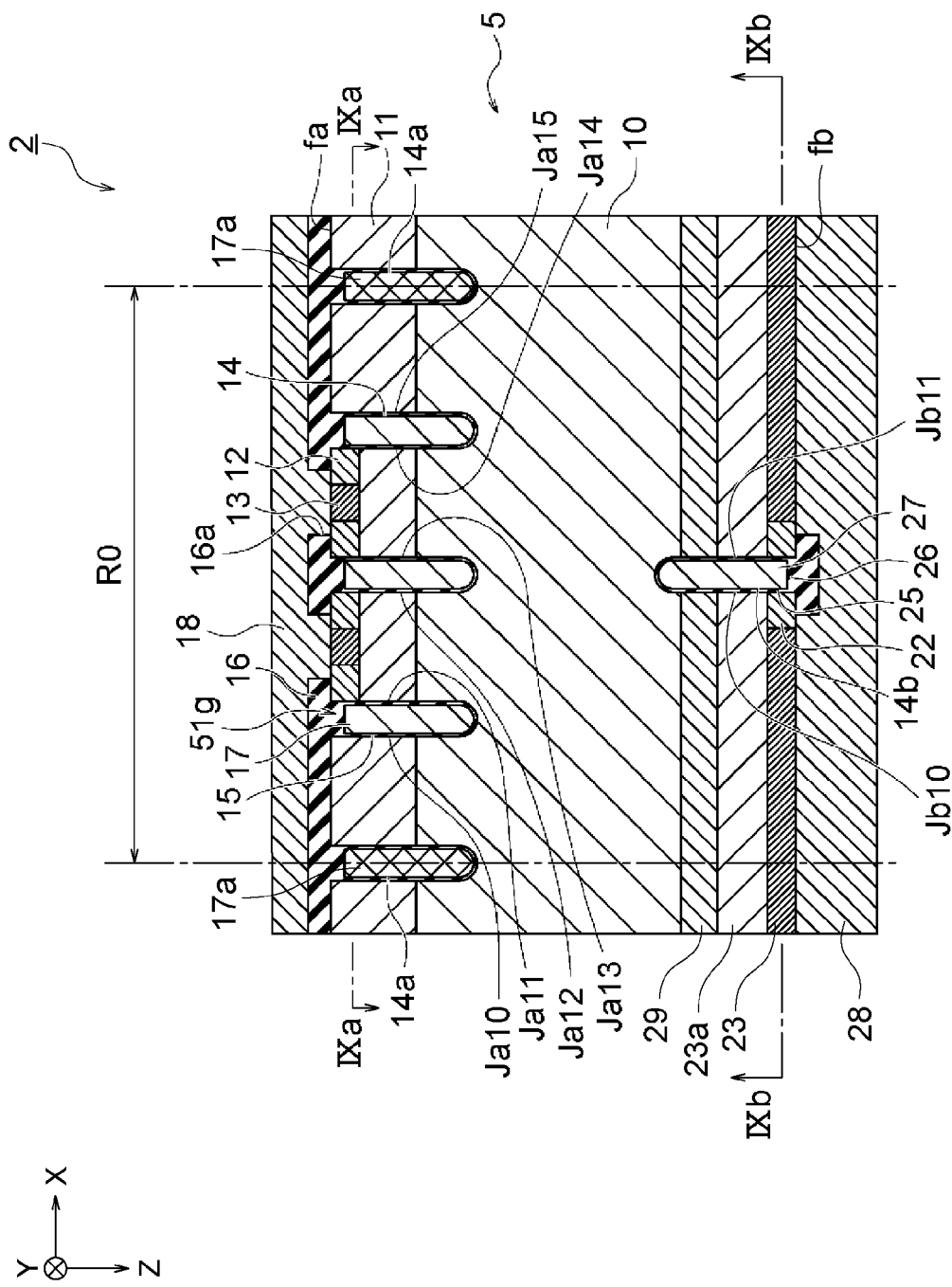
FIG. 8 is a cross-sectional view for illustrating a configuration of a semiconductor device of a first modification example.
Figure 9A:
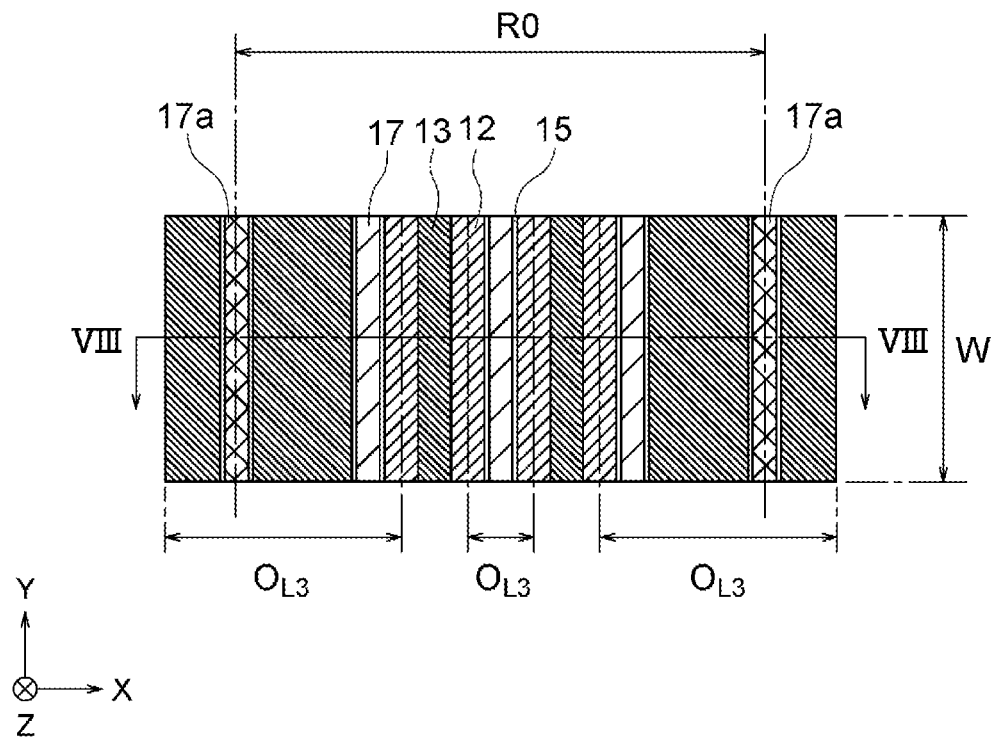
FIG. 9A is a cross-sectional view of the semiconductor device illustrated in FIG. 8 when a cross section taken along line IXa-IXa is viewed from above to below.
Figure 9B:
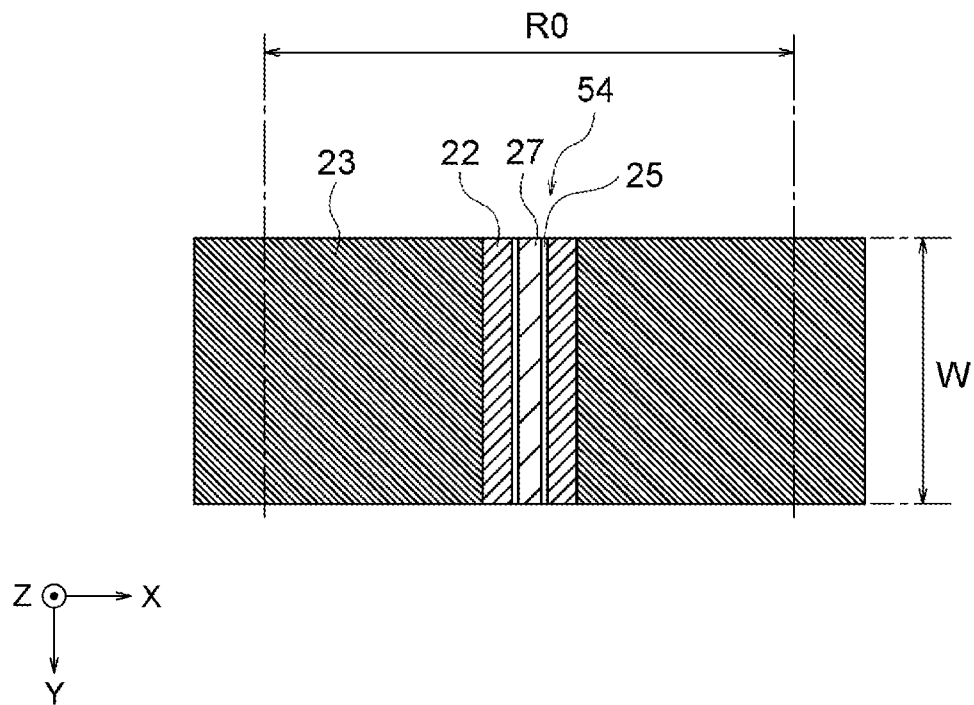
FIG. 9B is a cross-sectional view of the semiconductor device illustrated in FIG. 8 when a cross section taken along line IXb-IXb is viewed from below to above.

FIG. 8 is a cross-sectional view illustrating a configuration of a semiconductor device 2 according to a first modification example. FIG. 9A is a cross-sectional view of a cross-sectional portion along line IXa-IXa of the semiconductor device 2 illustrated in FIG. 8 as viewed from above to below. FIG. 9B is a cross-sectional view of a cross-sectional portion of the semiconductor device 2 taken along line IXb-IXb as viewed from below to above. Note that FIG. 8 illustrates a side cross-sectional configuration of the semiconductor device 2 as viewed from the position of line VIII-VIII illustrated in FIG. 9A in the configuration in which the emitter electrode 18, the collector electrode 28, and the like are provided in FIGS. 9A and 9B.

In the semiconductor device 2, it is preferable that five trench holes 14 are formed in the element region R0, the dummy gate electrode 17a is formed via a gate insulating film 15 in the trench holes 14 a at the right most end and the left most end in FIG. 8, an emitter-side gate electrode 17 is formed via a gate insulating film 15 in the remaining center three trench holes 14, and the dummy gate electrode 17a is short-circuited with the emitter layer 11.

In the first modification example, the emitter n layer 12 and the emitter p layer 13 are formed on the first surface fa between the three emitter-side gate electrodes 17 at the center, respectively, and the emitter p⁻ layer 11 is covered with the interlayer insulating layer 16 without forming the emitter n layer 12 and the emitter p layer 13 on the first surface fa between the dummy gate electrode 17a and the emitter-side gate electrode 17. $O_{L3}$ in FIG. 9A indicates the length of each interlayer insulating layer 16 in the X direction.

As illustrated in FIGS. 8 and 9A, on the first surface fa side of the semiconductor device 2, four emitter-side facing regions Ja 11 to Ja 14 are provided as emitter-side facing regions Ja for forming an inversion layer in the emitter p⁻ layer 11 along the emitter-side facing region Ja in the emitter-side facing region Ja in which the emitter-side gate electrode 17 faces the emitter p⁻ layer 11 via the gate insulating film 15 in the element region R0.

Since the emitter n layer 12 is not formed on the first surface fa of the substrate 5 in the inversion layer formed on the emitter-side facing region Ja 10 side of the emitter-side gate electrode 17 facing the dummy gate electrode 17a, electrons are not injected into the inversion layer. Hereinafter, the emitter-side facing region Ja here refers to emitter-side facing regions Ja 11 to Ja 14 in which an inversion layer is formed and the formed inversion layer is connected to the emitter electrode via the emitter n layer 12. In other words, the first facing region in the first embodiment does not include a region that does not include the emitter n layer 12 for electrically connecting to the emitter electrode 18.

Here, assuming that the length of the emitter-side facing region Ja in the Y direction is W, the total of the first facing region lengths of the four emitter-side facing regions Ja 11 to Ja 14 in one element region R0 forming a repetitive pattern is 4·W.

As another embodiment of the first modification example, only the three emitter-side gate electrodes 17 may be formed in the element region R0 without forming the dummy gate electrode 17a. However, in this case, the etching rate and the selection ratio may vary between the center and the periphery of the element region R0 due to the microloading effect. In the first modification example, in order to suppress such variations, the dummy gate electrode 17a that does not contribute to the formation of the inversion layer is also formed, and the density of the dummy gate electrode 17a and the emitter-side gate electrode 17 in the element region R0 is made uniform.

Note that such a semiconductor device 2 according to the first modification example can be realized by changing a mask for injecting an impurity layer to be the emitter n layer 12 and the emitter p layer 13 and a mask for forming a contact hole.

The semiconductor device 2 according to the first modification example is different from that of the first embodiment in that a trench-type collector-side gate electrode 27 is provided on the second surface fb of the substrate 5. In this case, in the element region R0, one trench hole 14b is formed which penetrates the collector n layer 22, the collector p⁻ layer 23a, and the buffer layer 29 from the second surface fb and reaches the drift layer 10. In the trench hole 14b, the trench-type collector-side gate electrode 27 is provided via a gate insulating film 25. However, the collector-side gate electrode 27 may not penetrate the buffer layer 29.

In the semiconductor device 2, the collector p⁻ layer 23a is formed between the collector p layer 23 and the buffer layer 29, and in the collector p layer 23, collector n layers 22 are formed on both side surfaces of the trench hole 14b along the trench hole 14b. In FIG. 9B, in bottom view, the gate insulating film 25 is formed along two sides of the band-shaped collector-side gate electrode 27 in the longitudinal direction, and the collector n layer 22 is formed on the opposite side of the gate insulating film 25 that is not adjacent to the collector-side gate electrode 27.

An interlayer insulating layer 26 is provided below the collector-side gate electrode 27. The collector n layer 22, the collector p layer 23, and the interlayer insulating layer 26 disposed on the second surface fb of the substrate 5 are provided with the collector electrode 28.

The configuration in which the collector-side gate electrode 27 is a trench type is advantageous in increasing the area of the collector p layer 23 into which holes are injected. In addition, since the size of the inversion layer formed in the collector p layer 23 can be determined by lengthening the collector p⁻ layer 23a in the Z direction orthogonal to the second surface fb, the degree of freedom in designing the collector-side facing region Jb capable of defining the size of the inversion layer related to the discharge of electrons can be increased.

Here, when the length of the collector-side facing region Jb in the Y direction (second facing region length) is W, the total of the second facing region lengths of the two collector-side facing regions Jb 10 and Ja 11 in one element region R0 to be a repeated pattern is defined as 2·W.

In the semiconductor device 2 according to the first modification example, the case where the ratio (gate density ratio) Ja:Jb of the total of the first facing region lengths and the total of the second facing region lengths in the element region R0 when the total of the second facing region lengths in the element region R0 is 1 is 2:1 has been described.

In the above configuration, also in the semiconductor device 2 according to the first modification example, similarly to the first embodiment described above, by making the total length of the first facing region longer than the total length of the second facing region in the element region R0, the total length in the gate width direction of the inversion layer in the emitter p⁻ layer 11 is made longer than the total length in the gate width direction of the inversion layer in the collector p⁻ layer 23a. As a result, it is possible to reduce the switching loss at the time of turn-off while suppressing the conduction loss.

Second Modification Example

Figure 10:
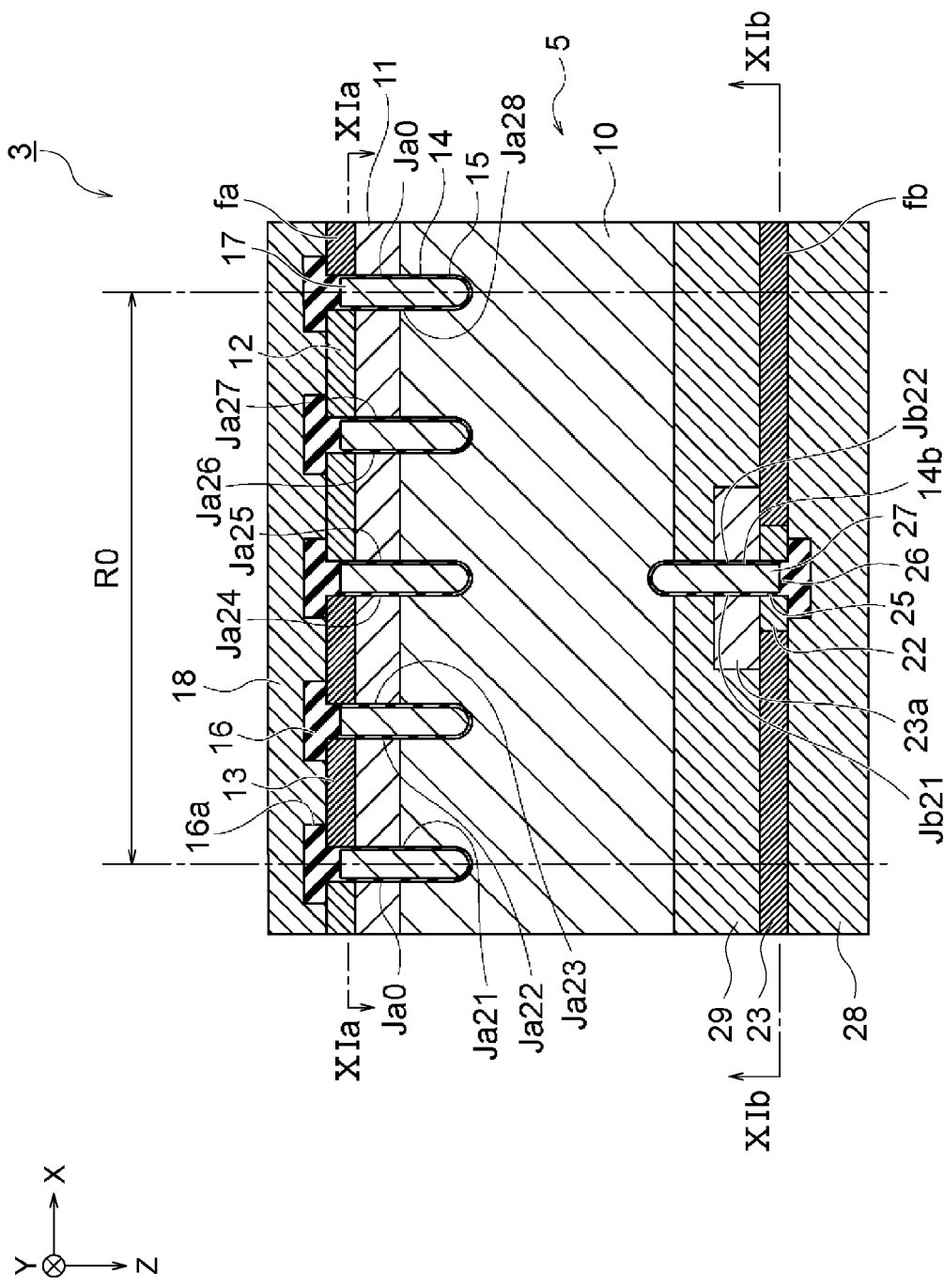
FIG. 10 is a cross-sectional view for illustrating a configuration of a semiconductor device of a second modification example.
Figure 11A:
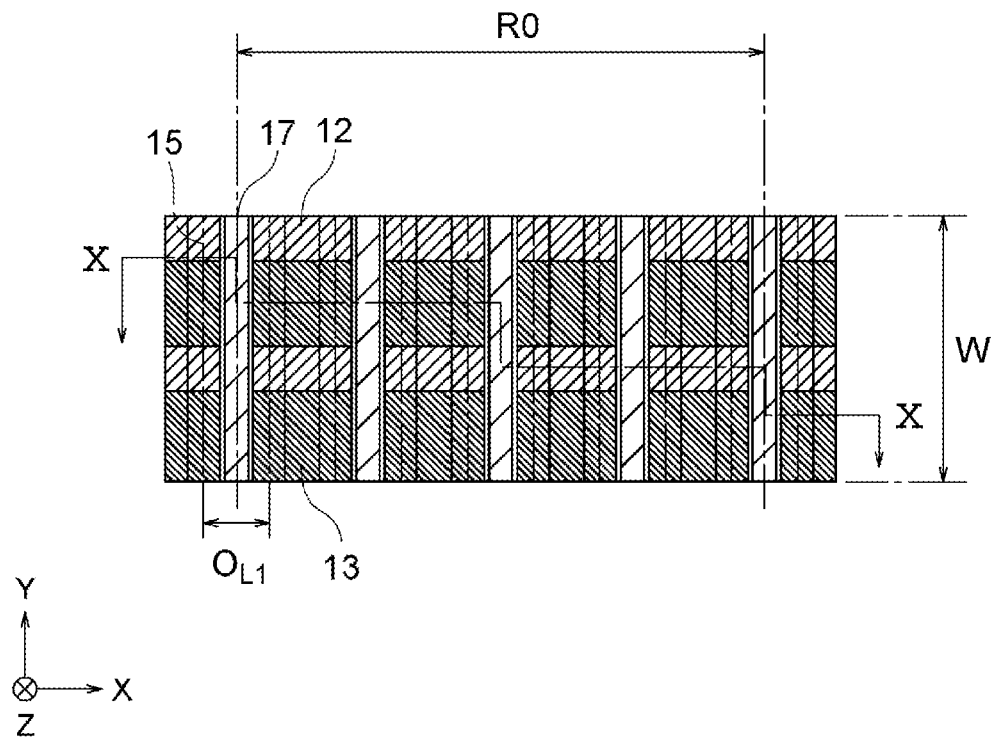
FIG. 11A is a cross-sectional view of the semiconductor device illustrated in FIG. 10 when a cross section taken along line XIa-XIa is viewed from above to below.
Figure 11B:
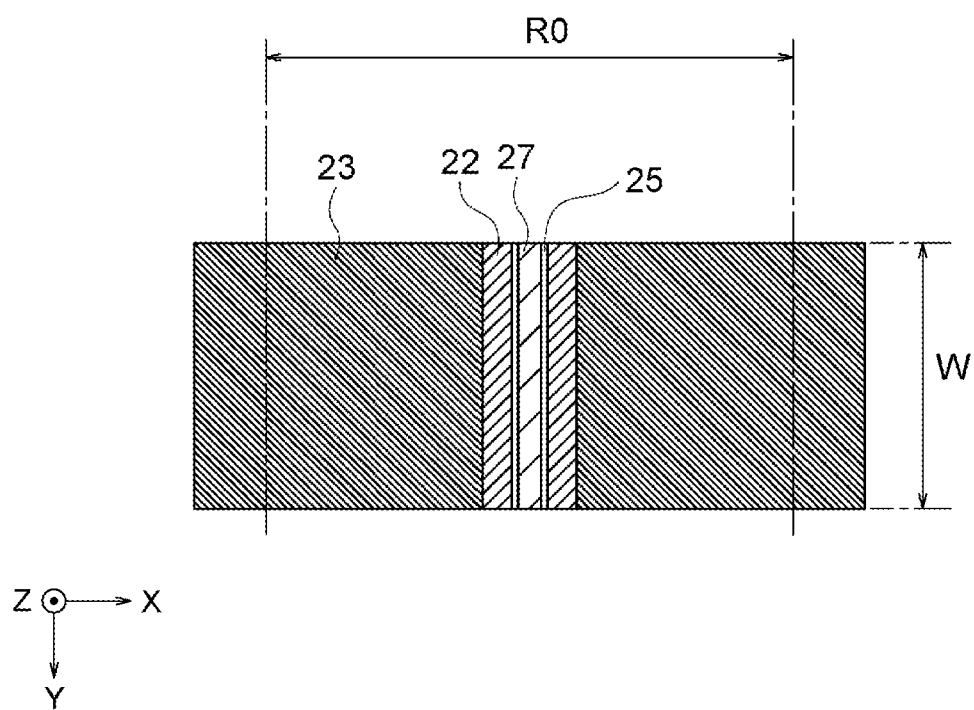
FIG. 11B is a cross-sectional view of the semiconductor device illustrated in FIG. 10 when a cross section taken along line XIb-XIb is viewed from below to above.

FIG. 10 is a cross-sectional view for illustrating a configuration of a semiconductor device 3 of a second modification example. FIG. 11A is a cross-sectional view of a cross-sectional portion along line XIa-XIa of the semiconductor device 3 illustrated in FIG. 10 as viewed from above to below. FIG. 11B is a cross-sectional view of a cross-sectional portion along line XIb-XIb of the semiconductor device 3 as viewed from below to above. Note that FIG. 10 illustrates a side cross-sectional configuration of the semiconductor device 3 as viewed from the position of the line X-X illustrated in FIG. 11A in the configuration in which the emitter electrode 18, the collector electrode 28, and the like are provided in FIGS. 11A and 11B.

The semiconductor device 3 includes five emitter-side gate electrodes 17 on the first surface fa. In the five emitter-side gate electrodes 17, a total of 10 emitter-side facing regions are formed. However, since the element region R0 of the semiconductor device 3 does not include the emitter-side facing regions Ja0 and Ja0 of the emitter-side gate electrode 17 at the rightmost end and the leftmost end in FIG. 10, the element region R0 includes eight emitter-side facing regions Ja 21 to Ja 28. Assuming that the length of the emitter-side facing region Ja in the Y direction is W, the total of the first facing region lengths of the eight emitter-side facing regions Ja 21 to Ja 28 in one element region R0 forming a repetitive pattern is 8·W.

As illustrated in FIGS. 10 and 11B, collector-side facing regions Jb 21 and Jb 22 are formed in the collector-side gate electrode 27 on the second face fb of the semiconductor device 3. Therefore, the total of the second facing region lengths of the two collector-side facing regions Jb 21 and Jb 22 in one element region R0 is 2·W.

In the semiconductor device 3 according to the second modification example, the case where the ratio (gate density ratio) Ja:Jb of the total of the first facing region length of the emitter-side facing region Ja and the total of the second facing region length of the collector-side facing region Jb in the element region R0 is 4:1 when the total of the second facing region lengths of the collector-side facing region Jb in the element region R0 is 1 has been described.

Similarly to the semiconductor device 2, the semiconductor device 3 includes a trench-type collector-side gate electrode 27 on the second surface fb. However, the semiconductor device 3 is different from the semiconductor device 2 in that the collector p⁻ layer 23a is formed in the buffer layer 29. In the semiconductor device 3, one trench hole 14b is formed which penetrates the collector n layer 22, the collector p⁻ layer 23a, and the buffer layer 29 from the second surface fb and reaches the drift layer 10. In the trench hole 14b, the trench-type collector-side gate electrode 27 is provided via a gate insulating film 25. However, the collector-side gate electrode 27 may not penetrate the buffer layer 29.

Further, as illustrated in FIG. 10, the semiconductor device 3 is different from the semiconductor devices 1 and 2 in that an emitter n layer 12 and an emitter p layer 13 are alternately formed in a direction (Y direction) of a gate width W of an emitter-side gate electrode 17. According to such a configuration, the pattern of the emitter n layer 12 and the emitter p layer 13 can be widened, and the semiconductor device 3 can be easily manufactured.

Also in the second modification having the above configuration, similarly to the first embodiment described above, by making the total of the lengths in the gate width direction of the emitter-side facing region Ja longer than the total of the lengths in the gate width direction of the collector-side facing region Jb in the element region R0, the total of the lengths in the gate width direction of the inversion layer in the emitter p⁻ layer 11 is made longer than the total of the lengths in the gate width direction of the inversion layer in the collector p⁻ layer 23*a*. As a result, it is possible to reduce the switching loss at the time of turn-off while suppressing the conduction loss.

(Others)

The first embodiment is not limited to the configuration described above. In the first embodiment described above, the case where the emitter-side gate electrode 17 is a trench-type gate electrode formed in the trench hole 14 formed in the first surface fa of the substrate 5 has been described, but the present invention is not limited thereto, and the emitter-side gate electrode 17 may be a planar-type gate electrode. The planar emitter-side gate electrode formed on the emitter side refers to a gate electrode disposed on the surface of the first surface fa via an insulating film serving as a gate insulating film. Further, in the first embodiment, the collector-side gate electrode 27 may be a planar type gate electrode, or may be a trench-type collector-side gate electrode formed in a trench hole of the second face fb. In addition, a trench type gate electrode and a planar type gate electrode may be formed in a mixed manner on the first surface fa and the second surface fb of the substrate 5.

In addition, in any of the configurations described above, one collector-side gate electrode 27 is provided in the element region R0, but the first embodiment is not limited to one collector-side gate electrode 27, and a plurality of collector-side gate electrodes 27 may be provided in the element region R0. In addition, the first embodiment is not limited to the example in which the plurality of emitter-side gate electrodes 17 are provided in the element region R0, and one emitter-side gate electrode 17 may be provided in the element region R0. In addition, the emitter-side gate electrode 17 and the collector-side gate electrode 27 are not limited to have the same length in the gate width direction (that is, the Y direction), and may have different gate widths. Further, the element region R0 is not necessarily formed periodically and repeatedly in the entire region of the main region R1 ((a) of FIG. 15 and (b) of FIG. 15) of the element. Furthermore, the first embodiment may appropriately include other impurity layers and other elements depending on the design and application of the semiconductor device.

In addition, the semiconductor device may have a configuration in which the configuration of the first embodiment, the configuration of the first modification example, the configuration of the second modification example, and the configuration of the third modification example described above are appropriately combined.

Furthermore, the semiconductor device 1 according to the first embodiment, the semiconductor device 2 according to the first modification example, and the semiconductor device 3 according to the second modification example described above are not limited to those driven by the above-described operation. Hereinafter, modification examples of the operation of the semiconductor devices 1 to 3 (hereinafter, referred to as "semiconductor device 1 or the like") of the first embodiment will be described.

Figure 12:
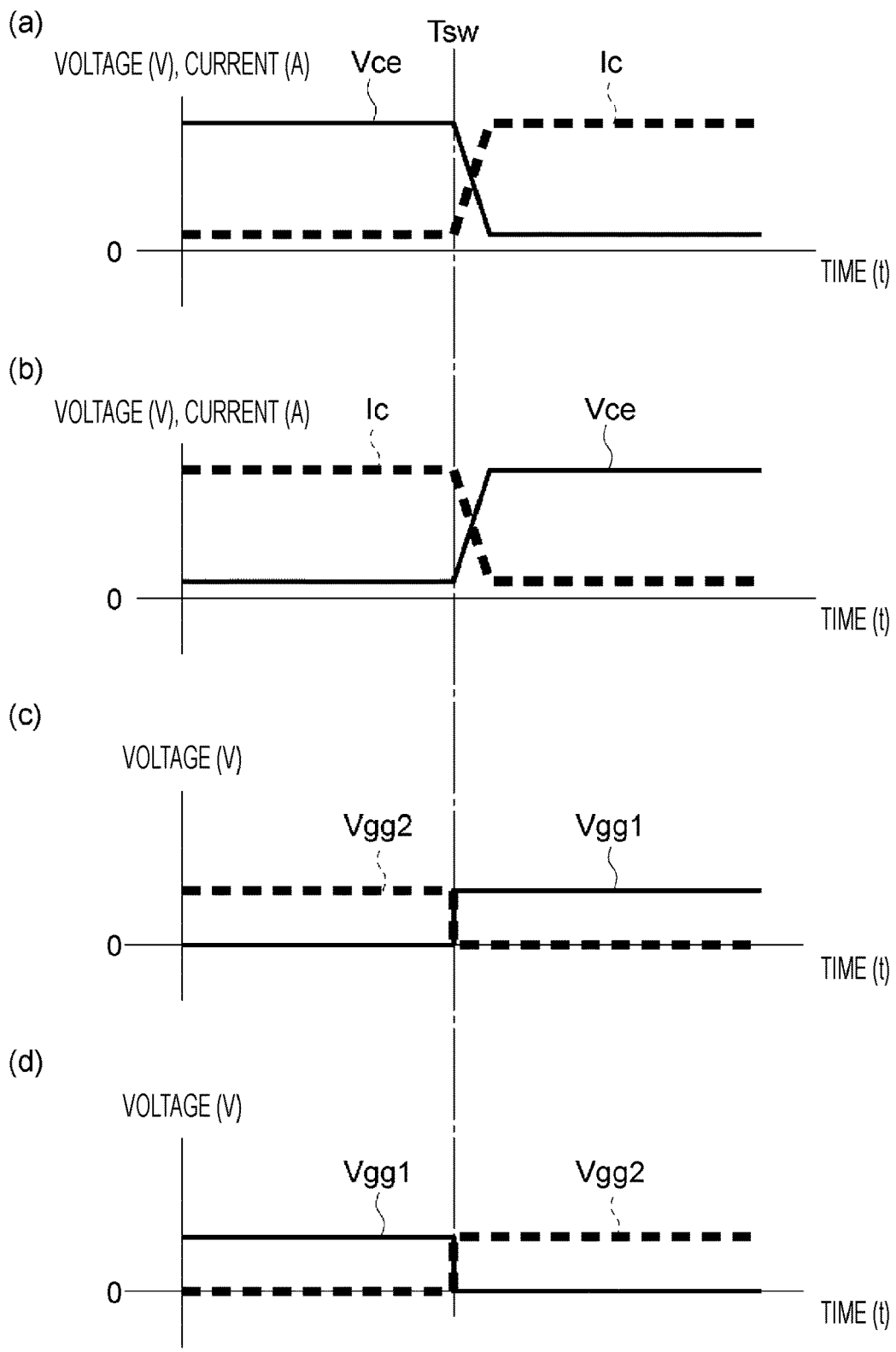
FIG. 12 is a timing chart for illustrating a modification example of an operation of the semiconductor device of the first embodiment.

(a) of FIG. 12 and (b) of FIG. 12 are views illustrating a voltage Vce between the emitter electrode 18 and the collector electrode 28 during the turn-on and turn-off of the semiconductor device 1 or the like, and a collector current Ic flowing through the collector electrode 28, respectively. (a) of FIG. 12 illustrates a voltage Vce and a collector current Ic during turn-on of the semiconductor device 1 or the like, and (b) of FIG. 12 illustrates the voltage Vce and the collector current Ic during the turn-off of the semiconductor device 1 or the like.

(c) of FIG. 12 is a diagram for illustrating voltages applied to the emitter-side gate electrode 17 and the collector-side gate electrode 27 during the turn-on illustrated in (a) of FIG. 12. (d) of FIG. 12 is a diagram for illustrating gate voltages applied to the emitter-side gate electrode 17 and the collector-side gate electrode 27 at the time of turn-off illustrated in FIG. 12(*b*). Note that, (c) of FIG. 12 and (d) of FIG. 12 are timing charts of the operation described as the operation of the semiconductor device 1 or the like.

In either (a) of FIG. 12 or (b) of FIG. 12, the horizontal axis represents the time, and the vertical axis represents the voltage or the current. In (a) of FIG. 12 and (b) of FIG. 12, solid lines represent the voltage Vce, and broken lines represent the collector current Ic. In addition, in any of (c) and (d) of FIG. 12, the horizontal axis represents the time, and the vertical axis represents the voltage. In (c) and (d) of FIG. 12, the solid lines indicate the gate voltage Vgg1 applied to the emitter-side gate electrode 17, and the broken lines indicate the gate voltage Vgg2 applied to the collector-side gate electrode 27.

As illustrated in (a) of FIG. 12, the semiconductor device 1 or the like are switched from the OFF state to the ON state during the turn on. At this time, as illustrated in (c) of FIG. 12, in the OFF state, the gate voltage Vgg2 is applied to the collector-side gate electrode 27, and a constant voltage Vce is applied between the emitter-side gate electrode 17 and the collector-side gate electrode 27. The gate voltage Vgg2 becomes 0 V at the timing Tsw of switching to the ON state, and the gate voltage Vgg1 is applied to the emitter-side gate electrode 17 instead. At this time, since the emitter-side gate electrode 17 is turned on, the resistance of the drift layer 10 is reduced, and the voltage Vce starts falling and takes a constant minimum value near 0 V. The collector current Ic takes a constant maximum value in the ON state of the semiconductor device 1 or the like.

Furthermore, as illustrated in (b) of FIG. 12, the semiconductor device 1 or the like are switched from the ON state to the OFF state during the turn off. At this time, as illustrated in (d) of FIG. 12, in the ON state, the gate voltage Vgg1 is applied to the emitter-side gate electrode 17, and the voltage Vce takes a constant minimum value. The gate voltage Vgg1 becomes 0 V at the timing Tsw of switching to the OFF state, and the gate voltage Vgg2 is applied to the collector-side gate electrode 27 instead. At this time, since the collector-side gate electrode 27 is turned on, the resistance of the drift layer 10 increases, and the voltage Vce starts to rise and takes a constant maximum value.

Figure 13:
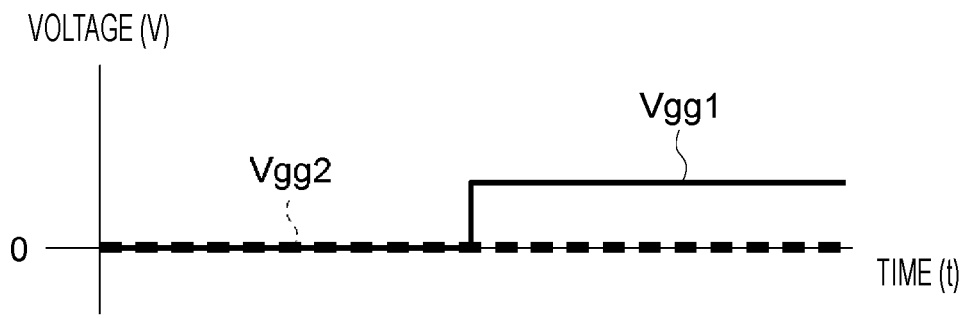
Figure 13:
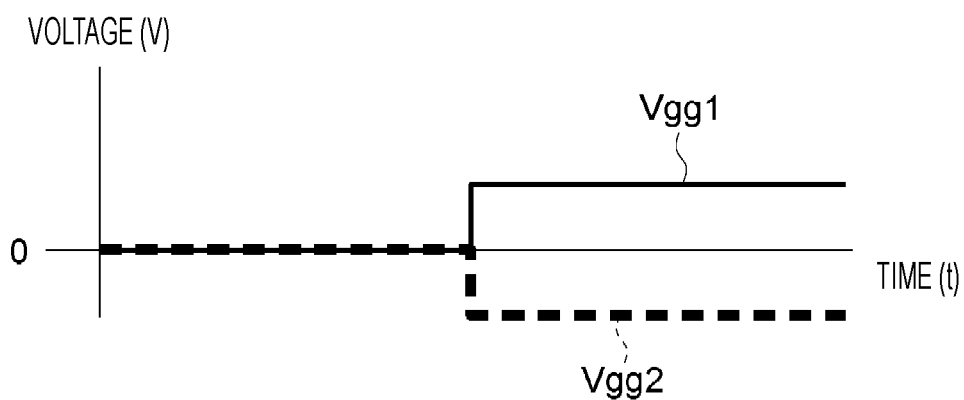
Figure 13:
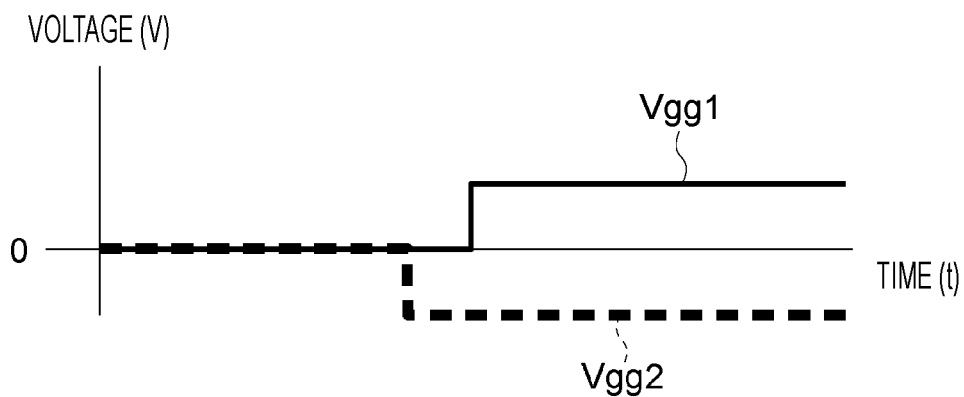

Next, an operation of applying a gate voltage to the emitter-side gate electrode 17 and the collector-side gate electrode 27 different from those in (c) of FIG. 12 and (d) of FIG. 12 will be described. (a) of FIG. 13, (b) of FIG. 13, and (c) of FIG. 13 are diagrams for illustrating the gate voltage Vgg1 applied to the emitter-side gate electrode 17 and the gate voltage Vgg2 applied to the collector-side gate electrode 27 at the time of turn-on. In any of (a) of FIG. 13 to (c) of FIG. 13, the gate voltage Vgg1 is applied to the emitter-side gate electrode 17 at the same timing as the gate voltage Vgg1 illustrated in (c) FIG. 12. (a) of FIG. 13 is a diagram illustrating an example of an operation in which the gate voltage Vgg2 of the collector-side gate electrode 27 is 0 V (0 bias) when the semiconductor device 1 or the like is turned off. In this case, the semiconductor device 1 or the like performs the same operation as the single type IGBT without the collector-side gate electrode 27.

However, in a case where the gate voltage is applied to the semiconductor device 1 or the like provided with the collector-side gate electrode 27 together with the emitter-side gate electrode 17 as illustrated in (a) FIG. 13, the area of the collector p⁻ layer 23 contributing to hole injection is reduced by providing the collector-side gate electrode 27. Therefore, when the gate voltage Vgg1 and the gate voltage Vgg2 illustrated in (a) of FIG. 13 are applied to the semiconductor device 1 or the like, the conduction loss may be larger than that of the single-type IGBT.

(b) of FIG. 13 is a diagram illustrating an example of an operation in which the collector-side gate electrode 27 is set to 0 bias when the semiconductor device 1 or the like is off, and the negative gate voltage Vgg2 is applied to the collector-side gate electrode 27 when the semiconductor device 1 or the like is on. According to such an operation, the collector p⁻ layer 23a under the collector-side gate electrode 27 contributes to injection of holes into the drift layer 10, and a conduction loss of the semiconductor device 1 or the like can be reduced.

(c) of FIG. 13 is a diagram illustrating an example of an operation in which the collector-side gate electrode 27 is set to 0 bias when the semiconductor device 1 or the like is off, and the negative gate voltage Vgg2 is applied to the collector-side gate electrode 27 earlier than the example illustrated in (b) of FIG. 13 when the semiconductor device 1 or the like is on. According to such an operation, the amount of holes injected from the collector p⁻ layer 23a to the drift layer 10 before turn-off can be increased to further reduce the conduction loss of the semiconductor device 1 or the like.

Figure 14:
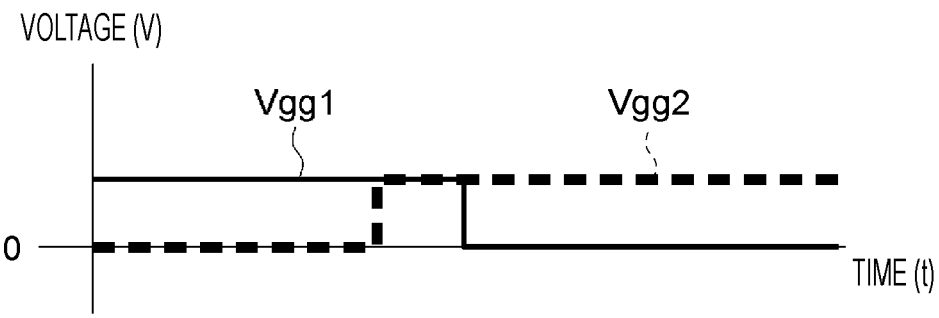
FIG. 14 is a timing chart for illustrating a modification example of an operation of the semiconductor device of the first embodiment when the semiconductor device is turned off.
Figure 14:
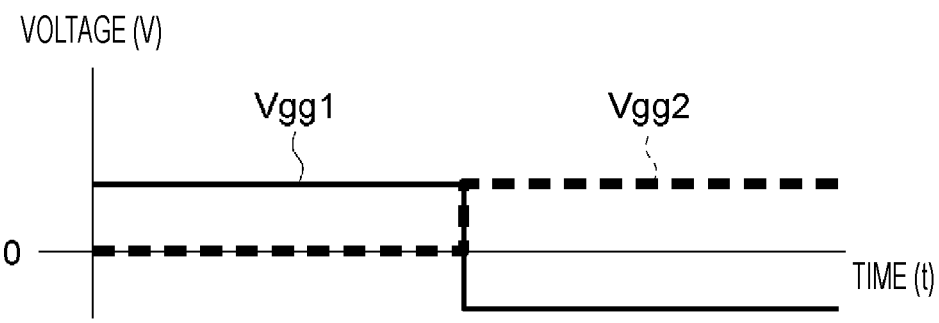
Figure 14:
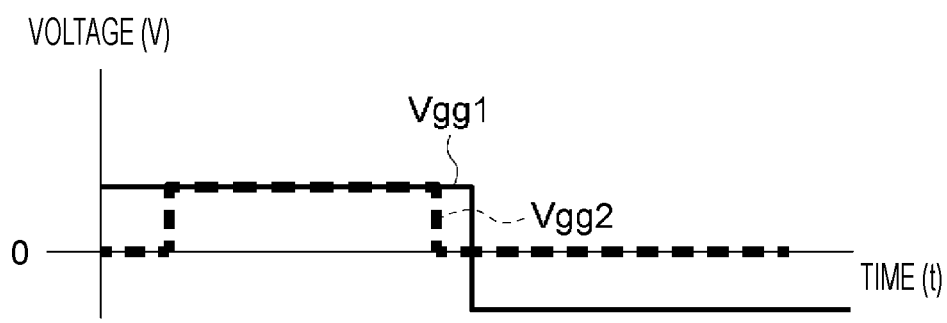
Figure 14:
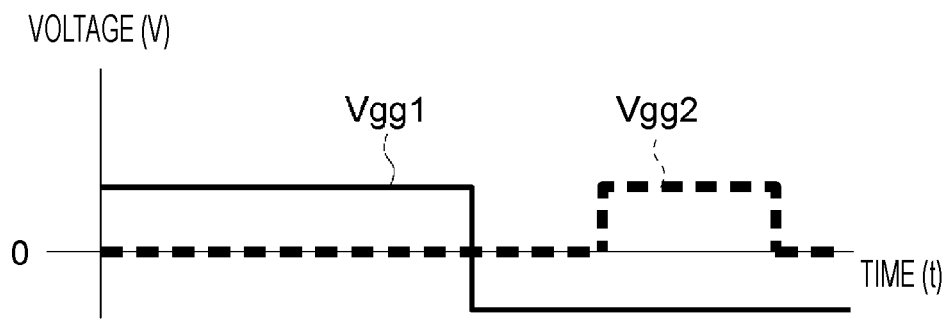

(a) of FIG. 14, (b) of FIG. 14, (c) of FIG. 14, and (d) of FIG. 14 are diagrams for illustrating the gate voltage Vgg1 applied to the emitter-side gate electrode 17 and the gate voltage Vgg2 applied to the collector-side gate electrode 27 at the time of turn-off. (a) of FIG. 14 is a diagram illustrating an example of the operation of applying the positive gate voltage Vgg2 to the collector-side gate electrode 27 before the timing at which the gate voltage Vgg1 falls when the semiconductor device 1 or the like is turned off. In the example illustrated in (a) of FIG. 14, the gate voltage Vgg1 is applied to the emitter-side gate electrode 17 at the same timing as the gate voltage Vgg1 illustrated in (d) of FIG. 12. According to such an operation, injection of holes from the collector p layer 23 to the drift layer 10 is suppressed before the semiconductor device 1 or the like is turned off, and the time from when the gate voltage Vgg1 is turned off until the collector current Ic takes the minimum value can be shortened, that is, the switching loss can be reduced.

(b) of FIG. 14 is a diagram illustrating an example of an operation in which the gate voltage Vgg1 applied to the emitter-side gate electrode 17 is switched from positive to negative when the semiconductor device 1 or the like is turned off. In the example illustrated in (b) of FIG. 14, the gate voltage Vgg2 applied to the collector-side gate electrode 27 is applied to the collector-side gate electrode 27 at the same timing as the gate voltage Vgg2 illustrated in (d) of FIG. 12. According to such an operation, the inversion layer La formed in the emitter-side facing region Ja of the collector-side gate electrode 27 disappears at an early stage, and injection of electrons into the drift layer 10 at the time of turn-off can be quickly suppressed. Therefore, in the example of the operation illustrated in (b) of FIG. 14, the switching loss of the semiconductor device 1 or the like can be reduced.

(c) of FIG. 14 is a diagram illustrating an example of an operation in which the gate voltage Vgg1 applied to the emitter-side gate electrode 17 falls to 0 V or a negative voltage (becomes a negative voltage in the example illustrated in (c) of FIG. 14) when the semiconductor device 1 or the like is turned off, and the positive gate voltage Vgg2 is applied to the collector-side gate electrode 27 while the positive gate voltage Vgg1 is applied. That is, the positive gate voltage Vgg1 is applied to the emitter-side gate electrode 17 at the timing when the semiconductor device 1 is turned on. The positive gate voltage Vgg2 rises after the start of application of the gate voltage Vgg1 and falls to 0 V at a timing before the gate voltage Vgg1 falls (turns off). According to such an operation, injection of holes into the drift layer 10 can be suppressed before the semiconductor device 1 or the like are turned off.

Furthermore, in the example of the operation illustrated in (c) of FIG. 14, if the negative gate voltage Vgg1 is applied to the emitter-side gate electrode 17 after the semiconductor device 1 or the like is turned off, holes accumulated in the drift layer 10 can be extracted to the emitter electrode 18, and the amount of holes in the drift layer 10 can be reduced in a short time. According to the operation illustrated in (c) of FIG. 14, a high switching loss reduction effect can be obtained. In the example of the operation illustrated in (c) of FIG. 14, there are a state in which the emitter n layer 12 and the drift layer are conductive and the collector n layer 22 and the drift layer are nonconductive, a state in which both the emitter n layer 12 and the drift layer and the collector n layer 22 and the drift layer are conductive, and a state in which both the emitter n layer 12 and the drift layer and the collector n layer 22 and the drift layer are nonconductive.

(d) of FIG. 14 is a diagram illustrating an example of an operation in which the positive gate voltage Vgg2 is applied to the collector-side gate electrode 27 after the gate voltage Vgg1 falls to 0 V or a negative voltage when the semiconductor device 1 or the like is turned off. According to such an operation, a part of the free wheeling current generated in the turn-on and turn-off loops of the semiconductor device 1 or the like flows from the emitter electrode 18 to the collector electrode 28 during the OFF state, and the free wheeling operation can be supported.

Second Embodiment

Next, a second embodiment of the present invention will be described. (a) of FIG. 15 and (b) of FIG. 15 illustrate a semiconductor device 6 of the second embodiment. (a) of FIG. 15 is a schematic view illustrating an upper surface configuration of a semiconductor chip 60 in which the semiconductor device 6 is formed when viewed from above, and (b) of FIG. 15 is a schematic view illustrating a lower surface configuration of the semiconductor chip 60 in which the semiconductor device 6 is formed when viewed from below.

As illustrated in (a) of FIG. 15, in the semiconductor device 6 according to the second embodiment, a main region R1 in which the emitter electrode 18 is formed and a peripheral region Re surrounding the periphery of the main region R1 are formed in the semiconductor chip 60. In the peripheral region Re, a field limiting ring (FLR) structure or the like for relaxing the electric field in the lateral direction is formed on one surface side where the emitter electrode 18 is formed. FIG. 16 is a cross-sectional view illustrating a side cross-sectional configuration in a region R of a boundary portion between the main region R1 and the peripheral region Re in a cross-sectional portion taken along line XV-XV of the semiconductor chip 60 illustrated in (a) of FIG. 15.

The main region R1 is a region where the above-described element region R0 is formed as a repeated pattern, and for example, the emitter-side gate electrode 17, the emitter electrode 18, the collector-side gate electrode 27, and the collector electrode 28 described in the first embodiment are repeatedly arranged at predetermined intervals. In the main region R1, an element region R0 of any one of the semiconductor device 1 according to the first embodiment (FIG. 1), the semiconductor device 2 according to the first modification example (FIG. 8), the semiconductor device 3 according to the second modification example (FIG. 10), or the semiconductor device 4 according to the third modification example is provided.

Note that, FIG. 16 illustrates, for example, an example in which the formation position of the collector-side gate electrode 27 is different from that of the element region R0 (FIG. 1) of the semiconductor device 1 according to the first embodiment, but the element region R0 of the semiconductor device 1 according to the first embodiment is provided, and the description thereof will be omitted below in order to avoid overlapping the description.

As illustrated in (a) of FIG. 15, in the peripheral region Re of the semiconductor device 6, for example, an emitter-side gate wiring 18a is provided to surround the emitter electrode 18. The emitter-side gate wiring 18a is electrically connected to each emitter-side gate electrode 17 inside by an emitter-side gate pad 18b, and applies the gate voltage to the emitter-side gate electrode 17. The peripheral region Re is a region in which the emitter electrode 18 provided on the first surface fa of the substrate 5, the emitter-side gate electrode 17 formed in the substrate 5, and the like are not formed on the upper surface side in the main region R1.

On the lower surface of the semiconductor chip 60, as illustrated in (b) of FIG. 15, the collector electrode 28 is provided in the main region R1, and the collector electrode 28 in the main region R1 extends to the peripheral region Re. That is, the formation region of the collector electrode 28 provided on the lower surface side of the semiconductor chip 60 is formed to be larger than the formation region of the emitter electrode 18 provided on the upper surface side of the semiconductor chip 60. In the collector electrode 28 illustrated in (b) of FIG. 15, the main region R1 illustrated in (a) of FIG. 15 is indicated by a two-dot chain line.

In the peripheral region Re on the lower surface of the semiconductor chip 60, for example, a collector-side gate wiring 28a is provided to surround the collector electrode 28. The collector-side gate wiring 28a is electrically connected to each collector-side gate electrode 27 inside by the collector-side gate pad 28b, and applies a gate voltage to the collector-side gate electrode 27. An electrode having the same potential as the collector electrode 28 may be further provided outside the collector-side gate wiring 28a on the other surface side where the collector electrode 28 is provided.

Here, a straight line e1 illustrated in (a) of FIG. 15 and (b) of FIG. 15 indicates positions of one side and the other side facing each other in the collector electrode 28 provided on the lower surface of the semiconductor chip 60 and having a substantially square shape in a bottom view. On the other hand, a straight line e2 illustrated in (a) of FIG. 15 indicates positions of one side and the other side facing each other, that is, positions of one side and the other side of the main region R1 in the emitter electrode 18 provided on the upper surface of the semiconductor chip 60 and having a substantially square shape in top view.

The straight line e1 along one side and the other side of the collector electrode 28 is positioned outside a straight line e2 along one side and the other side of the emitter electrode 18, the collector electrode 28 formed in the main region R1 extends to the peripheral region Re, and the collector electrode 28 is formed to be larger than the emitter electrode 18.

In the second embodiment, for example, the collector electrode 28 is formed to be large by a difference Y1 between the straight line e1 along one side of the collector electrode 28 and the straight line e2 along one side of the emitter electrode 18. Here, the sides configuring the four sides of the collector electrode 28 are separated from the sides constituting the four sides of the emitter electrode 18 by a difference Y1, and the collector electrode 28 is formed to be larger than the emitter electrode 18 as a whole.

In the second embodiment, the collector electrode 28 is formed to be larger than the emitter electrode 18 as a whole, but the present invention is not limited thereto, and at least one of the four sides of the collector electrode 28 may be separated from the side of the emitter electrode 18 by the difference Y1 to make the collector electrode 28 larger than the emitter electrode 18.

Next, a cross-sectional configuration of the peripheral region Re of the semiconductor device 6 according to the second embodiment will be described. In the peripheral region Re, as illustrated in FIG. 16, the substrate 5 provided in the main region R1 is provided, and the drift layer 10 of the substrate 5 is extended. The emitter p⁻ layer 11 formed in the main region R1 is extended on the first surface fa of the substrate 5 in the peripheral region Re, and the emitter p⁻ layer 11 is provided on the drift layer 10.

In the peripheral region Re, unlike the main region R1, the emitter-side gate electrode 17 is not provided on the first surface fa of the substrate 5, and the p-type impurity layer 131 having a polarity different from that of the drift layer 10 is provided. An insulating film 132 is formed on the first surface fa of the substrate 5 on which the emitter p⁻ layer 11 and the p-type impurity layer 131 are formed. The emitter-side gate wiring 18a is disposed at a predetermined position of the insulating film 132 formed in the p-type impurity layer 131.

On the other hand, the second face fb of the substrate 5 in the peripheral region Re has the same configuration as the second face fb of the substrate 5 in the main region R1, and includes the buffer layer 29, the collector p layer 23, the collector p⁻ layer 23a, the collector n layer 22, the collector-side gate electrode 27, and the like. In the second embodiment, the plurality of collector-side gate electrodes 27 are provided in the peripheral region Re, but the collector-side gate electrodes 27 and the surrounding configuration thereof have the same configuration.

In this case, the second surface fb of the substrate 5 in the peripheral region Re has the same configuration as the second surface fb of the substrate of the semiconductor device 1 according to the first embodiment described above. Specifically, the buffer layer 29 and the collector p layer 23 provided in the main region R1 are extended in the peripheral region Re, and the collector n layer 22 and the collector p⁻ layer 23a are formed in the collector p layer 23.

A part of the buffer layer 29 is exposed on the second face fb of the substrate, and the collector p⁻ layers 23a are formed on both sides of the buffer layer 29. In addition, on the second surface fb of the substrate, a collector n layer 22 is formed at a boundary between the collector p⁻ layer 23a and the collector p layer 23, and a collector-side gate electrode 27 is provided below the buffer layer 29 and the collector p⁻ layer 23a exposed on the second surface fb of the substrate via the gate insulating film 25. An interlayer insulating layer 26 is provided around the collector-side gate electrode 27.

On the second face fb of the substrate, an interlayer insulating layer 26 and a collector electrode 28 are disposed below the collector n layer 22 exposed on the second face fb. Similarly to the collector electrode 28 in the main region R1, the collector electrode 28 in the peripheral region Re is provided on the second surface fb to cover the second surface fb of the substrate and the interlayer insulating layer 26.

In the above configuration, in the semiconductor device 6 according to the second embodiment, the main region R1 having the element region R0 and the peripheral region Re adjacent to the main region R1 are provided. In the peripheral region Re, the emitter-side gate electrode 17 formed in the main region R1 is not formed, and the buffer layer 29, the collector p layer 23, the collector p⁻ layer 23a, the collector n layer 22, the collector-side gate electrode 27, and the collector electrode 28 provided in the main region R1 are formed.

As a result, in the semiconductor device 6 according to the second embodiment, during the on operation, not only in the main region R1 but also in the peripheral region Re, a forward bias is applied between the collector p layer 23 and the buffer layer 29 by a positive voltage, and holes can be injected into the drift layer 10. At this time, in the semiconductor device 6, holes can be injected into the drift layer 10 not only from the main region R1 but also from the peripheral region Re, so that more holes can be injected into the drift layer 10 than in a configuration in which holes are injected into the drift layer 10 only from the main region R1.

The difference Y1 between the side of the collector electrode 28 and the side of the emitter electrode 18 is preferably about the thickness of the substrate 5 or more. This is because the conductivity modulation region formed by the collector electrode 27 spreads in the direction of the substrate surface from the end of the emitter electrode 18 by about the thickness of the substrate 5, and thus it is desirable to provide the collector electrode 27 on the second surface fb in the range where the conductivity modulation region spreads in order to prevent an increase in the conduction loss.

Furthermore, according to the second embodiment, injection of holes from the peripheral region Re to the drift layer of the main region R1 can be efficiently stopped at the time of turn-off of the semiconductor device 6, and the switching loss can be reduced.

In the embodiment described above, the p-type is the first conductivity type and the n-type is the second conductivity type, but the present invention is not limited thereto, and the p-type may be the second conductivity type and the n-type may be the first conductivity type.

In the above-described embodiment, the case where the collector p⁻ layer 23a having an impurity concentration lower than that of the collector p layer 23 is separately provided as the impurity layer has been described, but the present invention is not limited thereto, and for example, a part of the collector p layer 23 may be simply used as the collector p⁻ layer 23a (impurity layer) without changing the impurity concentration between the collector p layer 23 and the collector p⁻ layer 23a.

REFERENCE SIGNS LIST 1, 2, 3, 4, 6: SEMICONDUCTOR DEVICE (SEMICONDUCTOR DEVICE)
5: SUBSTRATE
10: DRIFT LAYER (DRIFT LAYER)
11: EMITTER p⁻ layer (EMITTER LAYER)
12: EMITTER n LAYER (FIRST HIGH-CONCENTRATION IMPURITY LAYER)
13: EMITTER p LAYER
14, 14a, 14b: TRENCH HOLE
15: GATE INSULATING FILM (EMITTER-SIDE GATE INSULATING FILM)
17: EMITTER-SIDE GATE ELECTRODE
18: EMITTER ELECTRODE (EMITTER ELECTRODE)
22: COLLECTOR n LAYER (SECOND HIGH-CONCENTRATION IMPURITY LAYER)
23: COLLECTOR p LAYER (COLLECTOR LAYER)
23a: COLLECTOR p⁻ layer (IMPURITY LAYER)
25: GATE INSULATING FILM (COLLECTOR-SIDE GATE INSULATING FILM)
27: COLLECTOR-SIDE GATE ELECTRODE
28: COLLECTOR ELECTRODE (COLLECTOR ELECTRODE)
29: BUFFER LAYER
Ja: EMITTER-SIDE FACING REGION (FIRST FACING REGION)
Jb: COLLECTOR-SIDE FACING REGION (SECOND FACING REGION)
R0: ELEMENT REGION
R1: MAIN REGION

The invention claimed is:

1. A semiconductor device comprising:
an emitter layer of a first conductivity type;
a collector layer of a first conductivity type;
a drift layer of a second conductivity type provided between the emitter layer and the collector layer;
an emitter electrode electrically connected to the emitter layer;
a collector electrode electrically connected to the collector layer;
one or a plurality of emitter-side gate electrodes arranged to face the emitter layer with an emitter-side gate insulating film interposed therebetween;
a first high-concentration impurity layer of a second conductivity type provided between the emitter electrode and the emitter layer, the first high-concentration impurity layer having an impurity concentration higher than an impurity concentration of the emitter layer;
an impurity layer of a first conductivity type provided between the drift layer and the collector electrode;
one or a plurality of collector-side gate electrodes arranged to face the impurity layer with a collector-side gate insulating film interposed therebetween; and
a second high-concentration impurity layer of a second conductivity type provided between the collector electrode and the impurity layer and having an impurity concentration higher than that of the impurity layer, wherein
a total length of a first facing region of the emitter-side gate electrode in a gate width direction, the first facing region facing the emitter layer with the emitter-side gate insulating film interposed therebetween, is longer than a total length of a second facing region of the collector-side gate electrode in a gate width direction, the second facing region facing the impurity layer with the collector-side gate insulating film interposed therebetween.

2. The semiconductor device according to claim 1, wherein an ON state in which conduction is established between the first high-concentration impurity layer and the drift layer and non-conduction is established between the second high-concentration impurity layer and the drift layer, and a state in which conduction is established between at least the second high-concentration impurity layer and the drift layer are provided.

3. The semiconductor device according to claim 1, wherein a total length of the first facing region in the gate width direction is twice or more as long as a total length of the second facing region in the gate width direction.

4. The semiconductor device according to claim 1, wherein a total length of the first facing region in the gate width direction is four times or more as long as a total length of the second facing region in the gate width direction.

5. The semiconductor device according to claim 1, wherein the emitter-side gate electrode is a planar emitter-side gate electrode disposed on a surface of the emitter layer with an insulating film interposed therebetween or a trench emitter-side gate electrode formed in a trench hole of the emitter layer, and the collector-side gate electrode is a planar collector-side gate electrode disposed on a surface of the impurity layer or a trench collector-side gate electrode formed in a trench hole of the impurity layer.

6. The semiconductor device according to claim 1, wherein a configuration of an element region in which the emitter-side gate electrode and the collector-side gate electrode are disposed with a predetermined interval therebetween in a predetermined direction is set as one pattern, and the configuration of the element region is arranged as a repeated pattern at a predetermined cycle in a predetermined direction, and in the element region, a total length of the first facing region in the gate width direction is longer than a total length of the second facing region in the gate width direction.

7. The semiconductor device according to claim 6, wherein a main region having the element region and a peripheral region adjacent to the main region are provided, and in the peripheral region, the emitter-side gate electrode formed in the main region is not formed, and the collector layer, the collector electrode, the impurity layer, and the collector-side gate electrode are formed.

* * * * *